United States Patent
Wong et al.

(10) Patent No.: US 7,585,474 B2
(45) Date of Patent: Sep. 8, 2009

(54) TERNARY OXIDE NANOSTRUCTURES AND METHODS OF MAKING SAME

(75) Inventors: Stanislaus S. Wong, Stony Brook, NY (US); Tae-Jin Park, Port Jefferson, NY (US)

(73) Assignee: The Research Foundation of State University of New York, Albany, NY (US)

(*) Notice: Subject to any disclaimer, the term of this patent is extended or adjusted under 35 U.S.C. 154(b) by 285 days.

(21) Appl. No.: 11/581,766

(22) Filed: Oct. 13, 2006

(65) Prior Publication Data

US 2007/0138459 A1 Jun. 21, 2007

Related U.S. Application Data

(60) Provisional application No. 60/726,709, filed on Oct. 13, 2005.

(51) Int. Cl.
*C01G 1/02* (2006.01)
*C01G 29/00* (2006.01)
*C01G 49/02* (2006.01)
*C01G 49/04* (2006.01)

(52) U.S. Cl. .............. 423/1; 423/87; 423/138; 423/593.1; 423/594.1; 423/594.7; 977/893; 977/900

(58) Field of Classification Search ............ 423/1, 423/87, 138, 593.1, 594.1, 594.7; 428/402; 977/893, 900
See application file for complete search history.

(56) References Cited

U.S. PATENT DOCUMENTS

| | | | | | |
|---|---|---|---|---|---|
| 4,129,525 | A | * | 12/1978 | Horowitz et al. | 252/519.13 |
| 5,015,461 | A | * | 5/1991 | Jacobson et al. | 423/594.8 |
| 5,516,363 | A | * | 5/1996 | Azuma et al. | 106/287.18 |
| 7,056,471 | B1 | * | 6/2006 | Han et al. | 420/523 |
| 7,326,398 | B2 | * | 2/2008 | Domen et al. | 423/592.1 |
| 2006/0025301 | A1 | * | 2/2006 | Reddy et al. | 502/304 |

OTHER PUBLICATIONS

Mao, et al. Hydrothermal Synthesis of Perovskite Nanotubes. *Chem. Commun.*, 2003 408-409.
Martin, Charles R., Template Synthesis of Electronically Conductive Polymer Nanostructures. *Acc. Chem. Res.* 1995, 28:61-68.
Limmer, et al. Electrophoretic Growth of Lead Zirconate Titanate Nanorods. *Adv. Mater.*, 2001, 13(16): 1269-1272.
Toshimitsu, et al. Magnetic, Electric and Optical Functionalities of $(PLZT)_x(BiFeO_3)_{1-x}$ Ferroelectric—Ferromagnetic Thin Films. *Journal of Physics and Chemistry of Solids* 2003, 64:391-397.

(Continued)

*Primary Examiner*—H. (Holly) T Le
(74) *Attorney, Agent, or Firm*—Hoffmann & Baron, LLP

(57) ABSTRACT

A single crystalline ternary nanostructure having the formula $A_xB_yO_z$, wherein x ranges from 0.25 to 24, and y ranges from 1.5 to 40, and wherein A and B are independently selected from the group consisting of Ag, Al, As, Au, B, Ba, Br, Ca, Cd, Ce, Cl, Cm, Co, Cr, Cs, Cu, Dy, Er, Eu, F, Fe, Ga, Gd, Ge, Hf, Ho, I, In, Ir, K, La, Li, Lu, Mg, Mn, Mo, Na, Nb, Nd, Ni, Os, P, Pb, Pd, Pr, Pt, Rb, Re, Rh, Ru, S, Sb, Sc, Se, Si, Sm, Sn, Sr, Ta, Tb, Tc, Te, Ti, Tl, Tm, U, V, W, Y, Yb, and Zn, wherein the nanostructure is at least 95% free of defects and/or dislocations.

20 Claims, 20 Drawing Sheets

OTHER PUBLICATIONS

Gang, et al. Highly Flexible Polyelectrolyte Nanotubes. *J. Am. Chem. Soc.* 2003, 125:11140-11141.

Martin, Charles R., Nanomaterials: A Membrane-Based Synthetic Approach. *Science* 1994, 266:1961-1966.

Mao, et al. Large-Scale Synthesis of Single-Crystalline Perovskite Nanostructures. *J. Am. Chem. Soc.* 2003, 125:15718-15719.

Hill, Nicola A., Why Are There So Few Magnetic Ferroelectrics? *J. Phys. Chem. B* 2000, 104:6694-6709.

Hernandez, et al. Sol-Gel Template Synthesis and Characterization of $BaTiO_3$ and $PbTiO_3$ Nanotubes, *Chem. Matter.* 2002, 14:480-482.

Wada, et al. Magnetic Properties of Amorphous-like Oxides of the $Bi_2O_3$—$Fe_2O_3$—$PbTiO_3$ System Synthesized by Sol-Gel Method, *Materials Science and Engineering* 1996, A218/218:414-418.

Steinhart, et al. Polymer Nanotubes by Wetting of Ordered Porous Templates, *Science* 2002, 296:1997.

Steinhart, et al. Nanotubes by Template Wetting A Modular Assembly System, *Angew. Chem. Int. Ed.* 2004, 43:1334-1344.

Poghossian, et al. Bismuth Ferrites: New Materials for Semiconductor Gas Sensors, *Sensors and Actuators B*. 1991, 4:545-549.

Lim, et al. Preparation of $Ag_2S$ Nanocrystals of Predictable Shape and Size**, *Angew. Chem. Int. Ed.* 2004, 43:5685-5689.

Yu, et al. Controlled Synthesis of Monodisperse Silver Nanocubes in Water, *J. Am. Chem, Soc.* 2004, 126:13200-13201.

Xu, et al. Mechanistic Investigation on Salt-Mediated Formation of Free-Standing $Co_3O_4$ Nanocubes at 95° C., *J. Phys, Chem. B* 2003, 107:926-930.

Jin, et al. Thermally-Induced Formation of Atomic Au Clusters and Conversion into Nanocubes, *J. Am. Chem. Soc.* 2004, 126:9900-9901.

Wang, et al. Room Temperature Synthesis of $Cu_2O$ Nanocubes and Nanoboxes, *Solid State Communications* 2004, 130:585-589.

Liu, et al. Shape Control in Epitaxial Electrodeposition: $Cu_2O$ Nanocubes on InP(001), *Chem. Mater.* 2003, 15:4882-4885.

Gou, et al. Solution-Phase Synthesis of $Cu_2O$ Nanocubes, *Nano Letters* 2003, 3(2):231-234.

Kim, et al. Platonic Gold Nanocrystals**, *Angew. Chem. Int. Ed.* 2004, 43:3673-3677.

He, et al. Solvothermal Synthesis of Sodium and Potassium Tantalate Perovskite Nanocubes, *Chemistry Letters* 2004, 33(7):900-901.

Agnoli, et al. Synthesis of Cubic Antiferromagnetic KMnF3 Nanoparticles Using Reverse Micelles and Their Self-Assembly**, *Adv. Mater.* 2001, 13(22) 1697-1699.

Park, et al. Synthesis and Characterization of Multiferroic $BiFeO_3$ Nanotubes, *Chem. Commun.* 2004, 2708-2709.

Giaquinta, et al. Structural and Magnetic Studies of $Bi_2Fe_{4-x}Al_xO_9$, *Journal of Solid State Chemistry* 1995, 114:199-205.

Giaquinta, et al. Synthesis, Structure, and Magnetic Properties of the Layered Bismuth Transition Metal Oxide Solid Solution $Bi_2Fe_{4-x}Al_xO_9$, *Journal of Solid State Chemistry* 1992, 99:120-133.

Gou, et al. Controlling the Size of $Cu_2O$ Nanocubes from 200 to 25 nm, *J. Mater. Chem.* 2004, 14:735-738.

Xu, et al. Self-Generation of Tired Surfactant Superstructures for One-Pot Synthesis of $Co_3O_4$ Nanocubes and Their Close-and Non-Close-Packed Organizations, *Langmuir* 2004, 20:9780-9790.

Li, et al. Nanoindentation of $Cu_2O$ Nanocubes, *Nano Letters* 2004, 4(10):1903-1907.

Sun, et al. Size-controllable Luminescent Single Crystal $CaF_2$ Nanocubes, *Chem. Commun.*, 2003, 1768-1769.

Feng, et al. Size-Controlled Growth of $Co_3O_4$ Nanocubes, *Chem. Mater.* 2003, 15:2829-2835.

Dumestre, et al. Superlattices of Iron Nanocubes Synthesized from $Fe[N(SiMe_3)_2]_2$, *Science* 2004, 303:821-823.

Urban, et al. Synthesis of Single-Crystalline $La_{1-x}Ba_xMnO_3$, *Nano Letters* 2004, 4(8):1547-1550.

Spooren, et al. Chemistry of Materials, *Chem. Mater.* 2003, 15(7):1401-1403.

Mao, et al. Large-Scale Synthesis of Single-Crystalline Perovskite Nanostructures, *J. Am. Chem. Soc.* 2003, 125:15718-15719.

Mao, et al. General, Room-Temperature Method for the Synthesis of Isolated as Well as Arrays of Single-Crystalline ABO4-Type Nanorods, *J. Am. Chem. Soc.* 2004, 126:15245-15252.

Xiong, et al. Hydrothermal Synthesis and Characterization of $Bi_2Fe_4O_9$ Nanoparticles, *Chemistry Letters* 2004, 33(5):502-503.

Li, et al. Synthesis and Characterization of Monoclinic ZrO2 Nanorods by a Novel and Simple Precursor Thermal Decomposition Approach, *Solid State Communications* 2003, 127:639-643.

Wang, et al. Epitaxial BiFeO3 Multiferroic Thin Film Heterostructures, *Science* 2003, 299:1719-1722.

Ederer, et al. Influence of Strain and Oxygen Vacancies on the Magnetoelectric Properties of Multiferroic Bismuth Ferrite, *Physical Review B* 2005, 71:224103-1 to 224103-9.

Ghosh, et al. Low-Temperature Synthesis of Nanosized Bismuth Ferrite by Soft Chemical Route, *J. Am. Ceram. Soc.* 2005, 88(5):1349-1352.

Yun, et al. Structural and Multiferroic Properties of $BiFeO_3$ Thin Films at Room Temperature, *Journal of Applied Physics* 2004, 96(6):3399-3403.

Qi, et al. Epitaxial Growth of BiFeO3 Thin Films by LPE and sol-gel Methods, *Journal of Magnetism and Magnetic Materials* 2004, 283:415-421.

Singh, et al. Epitaxial $BiFeO_3$ Thin Films Fabricated by Chemical Solution Deposition, *Applied Physics Letters* 2006, 88:162904-1 to 162904-3.

Lee, et al. Surface Chemistry and Nanoscale Characterizations of Multiferroic $BiFeO_3$ Thin Films, *Electrochemical and Solid-State Letters* 2005, 8(10):F43-F46.

Wang, et al. Erratum: "Multiferroic BiFeO3 Thin Films Prepared via a Simple Sol-gel Method,"*Applied Physics Letters* 2006, 88:259902.

Eerenstein, et al. Comment on Epitaxial $BiFeO_3$ Multiferroic Thin Film Heterostructures, *Science* 2005, 307:1203a.

Wang, et al. Response to Comment on "Epitaxial $BiFeO_3$ Multiferroic Thin Film Heterostructures,"*Science* 2005, 307:1203b.

Neaton, et al. First-principles Study of Spontaneous Polarization in Multiferroic $BiFeO_3$, *Physical Review B* 2005, 71:014113-1 to 014113-8.

Ederer, et al. Weak Ferromagnetism and Magnetoelectric Coupling in Bismuth Ferrite, *Physical Review B* 2005, 71:R060401-1 to R060401-4.

Tokura, Yoshinori. Multiferroics as Quantum Electromagnets, *Science* 2006, 312:1481-1482.

Dho, et al. Large Electric Polarization and Exchange Bias in Multiferroic $BiFeO_3$, *Adv. Mater.* 2006, 18:1445-1448.

Blaauw, et al. Magnetic and Structural Properties of BiFeO3, *J. Phys. C.: Solid State Phys.* 1973, 6:1422-1431.

Zalessky, et al. Fe NMR Study of Spin-modulated Magnetic Structure in $BiFeO_3$, *Europhys. Lett.* 2000, 50(4): 547-551.

Coey, J.M.D., Noncollinear Spin Arrangement in Ultrafine Ferrimagnetic Crystallites, *Physical Review Letters* 1971, 27(17):1140-1142.

Singh, et al. Polarized Raman Scattering of Muliferroic $BiFeO_3$ Thin Films with Pseudo-Tetragonal Symmetry, *Physical Review B* 2005, 72:132101-1 to 132101-4.

Nadifi, et al. Superconductive Percolation in Bi-based Superconductor/Bi-based Insulator Composites: case of Bi-2223/Bi-2310 and Bi-2212/$BiFeO_3$, *Supercond. Sci. Technol.* 2000, 13:1174-1179.

Jiang, et al. The thickness Dependence of Ferroelectric and Magnetic Properties in Epitaxial BiFeO3 Thin Films, *Journal of Applied Physics* 2006, 99:103901-1 to 103901-6.

Pradham, et al. Magnetic and Electrical Properties of Single-Phase Multiferroic BiFeO3, *Journal of Applied Physics* 2005, 97:093903-1 to 093903-4.

Wang, et al. Room-temperature Saturated Ferroelectric Polarization in BiFeO3 Ceramics Synthesized by Rapid Liquid Phase Sintering, *Applied Physics Letters* 2004, 84(10)1731-1733.

* cited by examiner

TERNARY OXIDE NANOSTRUCTURES AND METHODS OF MAKING SAME

CROSS-REFERENCE TO RELATED APPLICATION

This application claims the benefit of U.S. Provisional Application No. 60/726,709, filed Oct. 13, 2005, which is incorporated herein by reference in its entirety.

This invention was made with support by the US Department of Energy under contract number DE-AC02-98CH10886, the donors of the American Chemical Society under the auspices of the Petroleum Research Fund, and the National Science Foundation (CAREER award DMR-0348239. The Government has certain rights in this invention.

BACKGROUND OF THE INVENTION

Monodispersed inorganic mesoscopic structures with well-defined size, shape, chemical composition, and crystallinity, such as nanospheres, nanorods (i.e., nanowires) and nanocubes, have attracted extensive synthetic attention as a result of their novel morphology-dependent properties, which are different from that of the bulk (Xia et al., *Adv. Mater.*, 2003, 15:353; Patzke et al., *Angew. Chem. Int. Ed.*, 2002, 41:2446; Rao et al., *Dalton Trans.*, 2003, 1; Alivisatos, A. P., *Science*, 1996, 271, 933; Cui et al., *Science*, 2001, 291, 851; Sun et al., *Science*, 2002, 298, 2176; Ahmadi et al., *Science*, 1996, 272, 1924).

Among the various classes of nanostructures, nanocubes have recently generated interest as potential building blocks in nanodevices, nanosensors, and functional nanomaterials. For example, a variety of nanocubes, such as metallic Ag/Au, zerovalent Fe, photoluminescent $In(OH)_3/In_2O_3$, narrow band-gap semiconducting $Ag_2S$, p-type semiconducting $Cu_2O$, luminescent $CaF_2$, and magnetic p-type semiconducting $Co_3O_4$, have been successfully synthesized primarily through solution-mediated reactions (Lim et al., *Angew. Chem. Int. Ed.*, 2004, 43, 5685; Gou et al., *J. Mater. Chem.*, 2004, 14, 735; Yu et al., *J. Am. Chem. Soc.*, 2004, 126, 13200; Xu et al., *Langmuir*, 2004, 20, 9780).

By analogy, the production of magnetic materials at the nanoscale promises to be significant for technologies involving data storage density, quantum computing, spintronics, and technologies involving memory and sensor development (H. Schmid, *Ferroelectrics*, 1999, 221:9; Fiebig et al., *Nature*, 2002, 419:818).

For example, $BiFeO_3$ shows ferroelectricity with a high Curie temperature ($T_C$) of ~1103 K, and antiferromagnetic properties below a Néel temperature ($T_N$) of 643 K (Wang et al., *Science*, 2003, 299, 1719). Ferroelectricity is an electrical phenomenon whereby certain ionic crystals may exhibit a spontaneous dipole moment. Structural analysis of $BiFeO_3$ indicates that it possesses a rhombohedrally distorted perovskite structure with R3c symmetry (a=b=c=5.63 Å, $\alpha=\beta=\gamma=59.4°$) at room temperature (Kubel et al., *Acta Crystallogr. B*, 1990, 46, 698).

Also, because of their high sensitivity to ethanol and acetone vapors, bismuth ferrites have been recently considered as new materials for semiconductor gas sensors (Poghossian et al., *Sens. Actuators B*, 1991, 4, 545). In particular, the catalytic potential of $Bi_2Fe_4O_9$ for ammonia oxidation to NO is of current interest as these iron-based materials may likely replace current, irrecoverable, and costly catalysts based on platinum, rhodium, and palladium (Zakharchenko et al. *Kinet. Catal.*, 2002, 43, 95. and Xiong et al., *Chem. Lett.*, 2004, 33, 502).

Despite the evident importance of $Bi_2Fe_4O_9$ as a functional material, many obstacles for creating nanoscale structural motifs of this bismuth ferrite have arisen (Xiong et al., *Chem. Lett.*, 2004, 33, 502).

For example, in its bulk form, measurement of ferroelectric and transport properties in bismuth ferrite has been limited by leakage problems, likely due to low resistivity, defects, and non-stoichiometry issues. To address this problem, recent approaches have focused on developing novel structures of $BiFeO_3$ (Li et al, *Mat. Res. Soc. Symp. Proc.*, 2002, 676: Y7.7.1). For instance, thin films of $BiFeO_3$ show enhanced physical properties such as spontaneous polarization, saturation magnetization, and a piezoelectric response, that are significantly enhanced relative to that of the bulk.

However, controllable synthesis and property evaluation of the magnetic materials has yet to be achieved. In particular, there have not been any viable or controllable syntheses of nanostructures of $BiFeO_3$.

Moreover, to date, little if any effort has been expended in research associated with the synthesis of substrate-free nanostructures of $BiFeO_3$. Moreover, there have not been any viable reports on their single-crystalline nanostructure analogues associated with 0-D and/or 1-D structural motifs.

The fabrication of nanostructures of magnetic materials is of fundamental importance in investigating the size correlation of the basic physical properties of these materials, with implications for their device applications. Accordingly, there is a need for the fabrication of well-defined sizes and shapes of nanostructures of magnetic materials

SUMMARY OF THE INVENTION

The present invention relates to single crystalline ternary nanostructures, including nanocubes, nano-orthorhombi, nanorods, nanotubes, rhombohedra and nanoparticles.

The single crystalline ternary nanostructures have the formula $A_xB_yO_z$, wherein x ranges from 0.25 to 24, and y ranges from 0.5 to 40, and z ranges from 2 to 100, and wherein A and B are independently selected from the group consisting of Ag, Al, As, Au, B, Ba, Br, Ca, Cd, Ce, Cl, Cm, Co, Cr, Cs, Cu, Dy, Er, Eu, F, Fe, Ga, Gd, Ge, Hf, Ho, I, In, Ir, K, La, Li, Lu, Mg, Mn, Mo, Na, Nb, Nd, Ni, Os, P, Pb, Pd, Pr, Pt, Rb, Re, Rh, Ru, S, Sb, Sc, Se, Si, Sm, Sn, Sr, Ta, Tb, Tc, Te, Ti, Tl, Tm, U, V, W, Y, Yb, and Zn. Preferably, the nanostructures are at least 95% free of defects and/or dislocations.

Examples of single crystalline ternary nanostructures have the formulae $Bi_xM_yO_z$, wherein M is a transitional metal, and $M'_xFe_yO_z$, wherein M' is a transitional metal.

In $Bi_xM_yO_z$, M is selected from the group consisting of Ag, Al, As, Au, B, Ba, Br, Ca, Cd, Cl, Cm, Co, Cr, Cs, Cu, Dy, Er, Eu, F, Fe, Ga, Gd, Ge, Hf, Ho, I, In, Ir, K, La, Li, Lu, Mg, Mn, Mo, Na, Nb, Nd, Ni, Os, P, Pb, Pd, Pr, Pt, Re, Rh, Ru, S, Sb, Sc, Se, Si, Sm, Sn, Sr, Ta, Tb, Te, Ti, Tl, Tm, U, V, W, Y, Yb, and Zn.

In $M'_xFe_yO_z$, M' is selected from the group consisting of Ag, Al, As, Au, B, Ba, Br, Ca, Cd, Cl, Cm, Co, Cr, Cs, Cu, Dy, Er, Eu, F, Fe, Ga, Gd, Ge, Hf, Ho, I, In, Ir, K, La, Li, Lu, Mg, Mn, Mo, Na, Nb, Nd, Ni, Os, P, Pb, Pd, Pr, Pt, Re, Rh, Ru, S, Sb, Sc, Se, Si, Sm, Sn, Sr, Ta, Tb, Te, Ti, Tl, Tm, U, V, W, Y, Yb, and Zn.

In one embodiment, the single crystalline ternary nanostructure consists essentially of $BiFeO_3$ or consists essentially of $BaCrO_4$ or consists essentially of $BaWO_4$ or consists essentially of $Bi_2Fe_4O_9$. Other examples are nanostructures consisting essentially of $BaTiO_3$, $SrTiO_3$, $CaTiO_3$, $PbTiO_3$, $ZrTiO_3$, or $Pb(Zr,Ti)O_3$.

In one aspect of the invention, the nanostructures can further comprises a doping perovskite wherein the nanostructure has the formula $(1-p)ABO_3$: $p A'_xB'_yO_z$ wherein x ranges from 0.25 to 24, y ranges from 0.5 to 40, z ranges from 2 to 100, and p ranges from 0 to 1. Some examples of such systems:

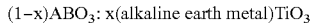
(1-x)$ABO_3$: x(alkaline earth metal)$TiO_3$

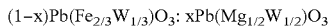
(1-x)$Pb(Fe_{2/3}W_{1/3})O_3$: $xPb(Mg_{1/2}W_{1/2})O_3$

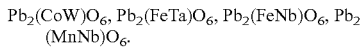
$Pb_2(CoW)O_6$, $Pb_2(FeTa)O_6$, $Pb_2(FeNb)O_6$, $Pb_2(MnNb)O_6$.

The present invention also includes methods of making the nanostructures. A description of the template method follows. In one embodiment, an aqueous bismuth reagent is mixed with an aqueous M-reagent, preferably with an aqueous reagent of a metal, more preferably with an aqueous reagent of a transitional metal. An aqueous solvent is added to the mixture to form a precursor mixture. Mixing can take place in any order. Preferably, the molar ratio of the bismuth reagent to the M-reagent is about 100 to 1, preferably, 20 to 1, even more preferably, 5 to 1, most preferably 3 to 1, and optimally, 1.5~2 to 1.

In another embodiment, an aqueous iron reagent is mixed with an aqueous M'-reagent, preferably with an aqueous reagent of a metal, more preferably with an aqueous reagent of a transitional metal. An aqueous solvent is added to the mixture to form a precursor mixture. Mixing can take place in any order. Preferably, the molar ratio of the M'-reagent to the iron reagent is about 100 to 1, preferably 20 to 1, even more preferably, 5 to 1, most preferably 3 to 1, and optimally, 1.5~2 to 1.

The precursor mixture comprising the bismuth reagent and M-reagent, or the iron-reagent and M'reagent, is stirred while heating for a period of time that would allow for a transparent sol comprising the ternary oxide nanostructure precursors to form. Droplets of the sol are then deposited onto a porous template surface with application of pressure to force the precursors into the pores. Pressure can be applied mechanically or gravitationally. Examples of templates include "track-etch" polymeric membranes; copolymer templates; Teflon membranes; zeolites; and porous alumina or silica membranes (including Anodisc membranes). Nanostructures are then retrieved.

The present invention also includes a molten salt method of making nanostructures. A description of the molten salt method follows. A bismuth reagent is mixed with a M-reagent, preferably with a reagent of a metal, more preferably with a reagent of a transitional metal, in the presence of a surfactant and a salt to produce nanostructures. Alternatively, an iron reagent is mixed with an M'-reagent, preferably with an reagent of a metal, more preferably with a reagent of a transitional metal, in the presence of a surfactant and a salt to produce nanostructures. In both embodiments, mixing can take place in any order. The resulting mixture is preferably ground, sonicated and heated to an annealing temperature. The mixture is then cooled to room temperature to yield a product.

The molar ratios of the bismuth reagent and the M-reagent can range from about 1:1 to about 100:1, preferably about 1:1 to about 10:1. The molar ratios of the M'-reagent and the iron reagent can range from about 1:1 to about 100:1, preferably about 1:1 to about 10:1.

The present invention also includes a sol gel method of making nanostructures. In this method an aqueous A reagent is mixed with an aqueous B reagent in an aqueous solvent to form a precursor mixture. The precursor mixture is heated to form a transparent sol comprising ternary oxide nanostructure precursors. The solvent is then removed.

The advantages of the present methods for the synthesis of magnetic nanostructures include its practicality, its generalizability, its relative simplicity, relative non-toxicity, facility of use, its green chemistry component (environmental friendliness), and versatility in the preparation of high aspect ratio nanostructures of ternary metal oxides. Additionally, the methods allow for predictive formation of different shapes of the products, such as, cubic, orthorhombic, and rod-like structures. Because of the simplicity and versatility of the methods, they are suitable for the large-scale preparation of important metal oxides with controllable size and shape.

DETAILED DESCRIPTION OF THE INVENTION

Figure 1:
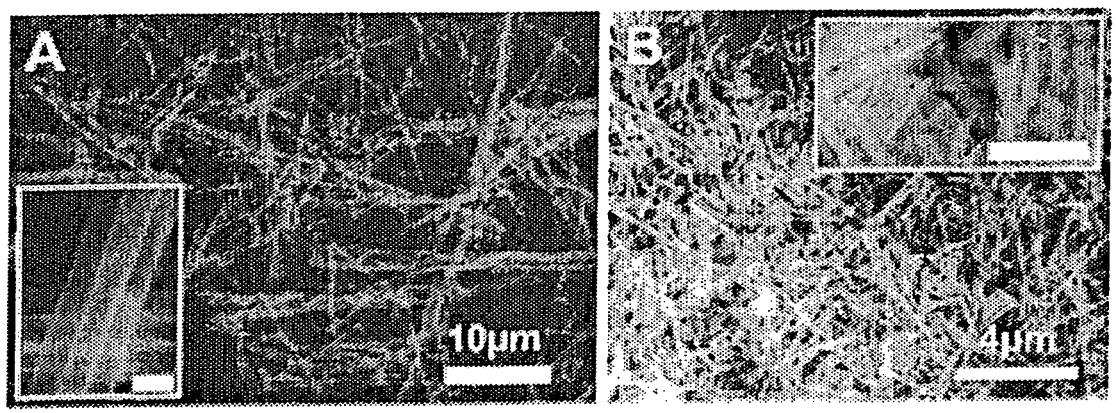
FIG. 1. SEM images of $BiFeO_3$ nanotubes (NTs) prepared in alumina membranes with 200 nm (A) and 100 nm (B) diameter pores, respectively. The insets of (A) and (B) show higher magnification images of as-prepared $BiFeO_3$ NTs, respectively. Scale bars in the insets of (A) and (B) indicate 500 nm.

The present invention relates to nanostructures, in particular to ternary oxide nanostructures, and methods of making same.

Single Crystalline Nanostructures

The present invention provides single crystalline nanostructures, including nanocubes, nano-orthorhombi, nanorods (also known as nanowires), nanotubes, nanoparticles, and rhombohedra.

The nanostructures of the invention are crystalline and solid. Preferably, the nanostructures are at least 95% free, more preferably at least 99% free, and most preferably virtually completely free of defects and/or dislocations. As defined in this specification, defects are irregularities in the crystal lattice (i.e., intrinsic defects). Some examples of defects include a non-alignment of crystallites, an orientational disorder (e.g., of molecules or ions), vacant sites with the migrated atom at the surface (Schottky defect), vacant sites with an interstitial atom (Frenkel defects), point defects, grain boundary defects, and non-stoichiometry of the crystal. An example of a dislocation is a line defect in a crystal lattice.

Additionally, the nanostructures are preferably at least 95% free, more preferably at least 99% free, and most preferably virtually completely free of amorphous materials and/or impurities. Examples of amorphous materials include organic surfactant molecular groups, such as bis(2-ethylhexyl)sulphosuccinate, undecylic acid, sodium dodecyl sulfate (SDS), Triton X-100, decylamine, or double-hydrophilic block copolymers, which are present on the surfaces of prior art nanostructures. Examples of impurities include an element different from the elements of the crystalline structure and a vacancy.

In some embodiments of the invention, the outer surface of the nanostructures contains amorphous carbon, with essentially little or no groups that are specifically oxygenated, e.g., COOH and OH. The presence of carbon as well as the absence of the surface oxygenated groups can be verified by IR spectroscopy, X-ray photoelectron spectroscopy or by using any other surface elemental analysis technique.

The sides of the nanocubes of the present invention range from about 1 nm to about 10 μm, from about 1 nm to about 1 μm, or from about 50-80 nm. The average size of a side of a nanocube is about 350 nm.

The nano-orthorhombi of the present invention have a higher aspect ratio than nanocubes. In particular, the widths of the nano-orthorhombi are about the same as the sides of the nanocubes. The lengths of the nano-orthorhombi are about twice as long as their widths.

The nanotubes and nanorods of the present invention have a higher aspect ratio than nano-orthorhombi. In particular, the lengths of the nanotubes and nanorods are about ten times as long as the lengths of the nano-orthorhombi. The widths of these structures tend to be at least about twice as long as the widths of the nano-orthorhombi. Nanotubes are hollow with varying wall thicknesses. Nanorods are solid.

The nanoparticles of the present invention range from about 14 nm to greater than about 100 nm. Nanoparticles are generally spherical in shape.

The chemical formulae of these ternary nanostructures include $A_xB_yO_z$, wherein x ranges from 0.25 to 24, and y ranges from 0.5 to 40, and z ranges from 2 to 100. The $A_xB_yO_z$ formula represents multifunctional or multiferroic materials. For example, these nanostructures include $Bi_xM_yO_z$, and $M'_xFe_yO_z$.

In $Bi_xM_yO_z$, M is selected from the group consisting of Ag(silver), Al(aluminum), As(arsenic), Au(gold), B(boron), Ba(barium), Br(bromine), Ca(calcium), Cd(cadmium), Ce(cerium), Cl(chlorine), Cm(curium), Co(cobalt), Cr(chromium), Cs(cesium), Cu(copper), Dy(dysprosium), Er(erbium), Eu(europium), F(fluorine), Fe(iron), Ga(gallium), Gd(gadolinium), Ge(germanium), Hf(hafnium), Ho(holmium), I(iodine), In(indium), Ir(iridium), K(potassium), La(lanthanum), Li(lithium), Lu(lutetium), Mg(magnesium), Mn(manganese), Mo(molybdenum), Na(sodium), Nb(niobium), Nd(neodymium), Ni(nickel), Os(osmium), P(phosphorus), Pb(lead), Pd(palladium), Pr(praseodymium), Pt(platinum), Rb(rubidium), Re(rhenium), Rh(rhodium), Ru(ruthenium), S(sulphur), Sb(antimony), Sc(scandium), Se(selenium), Si(silicon), Sm(samarium), Sn(tin), Sr(strontium), Ta(tantalum), Tb(terbium), Tc(technetium), Te(tellurium), Ti(titanium), Tl(thallium), Tm(thulium), U(uranium), V(vanadium), W(tungsten), Y(yttrium), Yb(ytterbium), and Zn(zinc).

In $M'_xFe_yO_z$, M' is selected from the group consisting of Ag(silver), Al(aluminum), As(arsenic), Au(gold), B(boron), Ba(barium), Br(bromine), Bi(bismuth), Ca(calcium), Cd(cadmium), Ce(cerium), Cl(chlorine), Cm(curium), Co(cobalt), Cr(chromium), Cs(cesium), Cu(copper), Dy(dysprosium), Er(erbium), Eu(europium), F(fluorine), Fe(iron), Ga(gallium), Gd(godolinium), Ge(germanium), Hf(hafnium), Ho(holmium), I(iodine), In(indium), Ir(iridium), K(potassium), La(lanthanum), Li(lithium), Lu(lutetium), Mg(magnesium), Mn(manganese), Mo(molybdenum), Na(sodium), Nb(niobium), Nd(neodymium), Ni(nickel), Os(osmium), P(phosphorous), Pb(lead), Pd(palladium), Pr(praseodymium), Pt(platinum), Rb(rubidium), Re(rhenium), Rh(rhodium), Ru(ruthenium), S(sulfur), Sb(antimony), Sc(scandium), Se(selenium), Si(silicon), Sm(samarium), Sn(tin), Sr(strontium), Ta(tantalum), Tb(terbium), Tc(technetium), Te(tellurium), Ti(titanium), Tl(thallium), Tm(thulium), U(uranium), V(vanadium), W(tungsten), Y(yttrium), Yb(ytterbium), and Zn(zinc).

Further examples of materials with the $A_xB_yO_z$ formula include perovskite type materials with the formula $ABO_3$. Such perovskite type materials include, for example, alkaline earth metal titanates, such as $BaTiO_3$, $SrTiO_3$, $CaTiO_3$, $PbTiO_3$, $ZrTiO_3$, and $Pb(Zr,Ti)O_3$, and their associated non-stoichiometric complexes, such as $(Ca, Sr, Ba)TiO_3$.

Further examples of materials with the $A_xB_yO_z$ formula are manganites, ruthenates, ferrites and borcites, and $BaCrO_4$ and $BaWO_4$.

Manganites include $M''MnO_3$, where M'' is Sc(scandium), Y(yttrium), In(indium), Bi(bismuth), Ho(holmium), Er(erbium), Tm(thulium), Yb(ytterbium), Lu(lutetium). Another example of a manganite is $TbMnO_3$. Further examples are $TbMn_2O_5$ and $DyMn_2O_5$.

Some examples of ruthenates include $CaRuO_3$, $SrRuO_3$, lanthanum ruthenates, barium ruthenates (10H-type BaRuO3 and Ba2Ru7O18), and R2Ru2O7 (R=Gd—Yb).

Some examples of ferrites include barium ferrites, $Bi_2Fe_4O_9$ and $BiFeO_3$

Boracites include $M'''_3Bi_7O_{13}$, where M''' is Cr, Mn, Fe, Co, Cu, Ni.

Also included in the present invention are non-integral, mixed stoichiometries based on structures with $A_xB_yO_z$ formula. Examples of such mixed stoichiometries follow.

In one aspect of the invention, the nanostructures can further comprises a doping perovskite wherein the nanostructure has the formula $(1-p)ABO_3$: $p\ A'_xB'_yO_z$ wherein x ranges from 0.25 to 24, y ranges from 0.5 to 40, z ranges from 2 to 100, and p ranges from 0 to 1. Some examples of such systems:

$(1-x)ABO_3$: x(alkaline earth metal)$TiO_3$ $(1-x)Pb(Fe_{2/3}W_{1/3})O_3$: $xPb(Mg_{1/2}W_{1/2})O_3$ $Pb_2(CoW)O_6$, $Pb_2(FeTa)O_6$, $Pb_2(FeNb)O_6$, $Pb_2(MnNb)O_6$.

$BaM''''F_4$, where M'''' is Mg, Mn, Fe, Co, Ni, Zn.

Methods of Making Nanostructures

Methods of making the nanostructures of the present invention include the use of templates, the use of a molten salt technique, and the use of a sol-gel technique. All the types of nanostructures described above can be made by all these methods.

In the methods of making nanostructures with the formula $A_xB_yO_z$, any compound comprising A and B can be used as reagents. For example, to make nanostructures with the formula $Bi_xM_yO_z$, any compound comprising bismuth can be used as a reagent. Examples of bismuth compounds (i.e., bismuth reagents) include bismuth nitrate ($Bi(NO_3)_3$); bismuth halides, such as, bismuth chloride ($BiCl_3$), bismuth fluoride ($BiF_3$), bismuth bromide ($BiBr_3$), and bismuth iodide ($BiI_3$); bismuth phosphates, bismuth carbonates, bismuth oxychloride, bismuth acetate; bismuth oxide ($Bi_2O_3$); bismuth oxyiodides; bismuth oxynitrates; bismuth hydroxides, and bismuth sulfates.

In the methods of making nanostructures with the formula $Bi_xM_yO_z$, any compound containing M can be used as a reagent. Such a compound is herein termed "M-compound" or "M-reagent." Preferably, metal salts, and more preferably transitional metal salts are used as M-reagents.

In the methods of making nanostructures with the formula $M'_xFe_yO_z$, any compound comprising iron an be used as a reagent. Examples of iron compounds (i.e., iron reagents) include iron oxalate; iron oxide; iron phosphate; iron sulfate; iron sulfites; iron pentacarbonyls; iron hexacarbonyls; elemental iron; iron nitrates, e.g., iron (III) nitrate ($Fe(NO_3)_3$); iron hydroxide; iron acetate; iron citrate; iron halides, i.e., iron bromide, iron chloride, iron iodide and iron fluoride; iron perchlorate; hematite ($Fe_2O_3$); goethite; magnetite ($Fe_3O_4$) and iron acetylacetonate.

In the methods of making nanostructures with the formula $M'_xFe_yO_z$, any compound containing M' can be used as a reagent. Such a compound is herein termed "M'-compound" or "M'-reagent." Preferably, metal salts, and more preferably transitional metal salts are used as M'-reagents.

Further examples of reagents include:

Ag(silver): acetate $CH_3CO_2Ag$, carbonate $Ag_2CO_3$, chloride, citrate, iodide, nitrate, oxide $Ag_2O$, perchlorate, phosphate $Ag_3PO_4$, sulfate, etc.

Al(aluminum): acetate $(CH_3CO_2)_2AlOH$, ammonium sulfate $AlNH_4(SO_4)_2$, bromide, chloride, hydroxide, isopropoxide $Al[(CH_3)_2CHO]_3$, lactate $Al[CH_3CH(OH)CO_2]_3$, nitrate, oxide, perchlorate $Al(ClO_4)_3$, phosphate $AlPO_4$, sulfate $Al_2(SO_4)_3$, etc.

Ba(barium): acetate $(CH_3CO_2)_2Ba$, bromide, carbonate, chloride, fluoride, hydroxide, iodide, isopropoxide, nitrate, oxalate, oxide, perchlorate, sulfate, etc.

Bi(bismuth): acetate, bromide, chloride, citrate, fluoride, iodide, nitrate, oxide, phosphate, subnitrate $BiONO_3$, etc.

Ca(calcium): acetate, bromide, carbonate, chloride, fluoride, hydroxide, iodide, isopropoxide, nitrate, oxalate, oxide, phosphate, propionate $(C_2H_5CO_2)_2Ca$, sulfate, etc.

Cd(cadmium): acetate $(CH_3CO_2)_2Cd$, bromide, carbonate $CdCO_3$, chloride $CdCl_2$, fluoride, hydroxide, iodide, nitrate $Cd(NO_3)_2$, oxide $CdO$, perchlorate $Cd(ClO_4)_2$, sulfate, alkylcadmium, etc.

Co(cobalt): acetate $(CH_3CO_2)_2Co$, bromide, carbonate, chloride, fluoride, hydroxide, iodide, nitrate, oxalate, oxide, perchlorate, sulfate, etc.

Cr(chromium): acetate hydroxide $(CH_3CO_2)_7Cr_3(OH)_2$, bromide, chloride ($CrCl_2$, $CrCl_3$), fluoride, nitrate, oxide ($Cr_2O_3$), perchlorate, phosphate, sulfate, etc.

Cs(cesium): acetate, bromide $CsBr$, carbonate, chloride, fluoride, hydroxide, iodide, nitrate, oxalate, perchlorate, sulfate, etc.

Cu(copper): acetate $(CH_3CO_2)_2Cu$, bromide, carbonate, chloride, fluoride, hydroxide, iodide, nitrate, oxide, perchlorate, sulfate, etc.

Dy(dysprosium): acetate $(CH_3CO_2)_3Dy$, bromide, carbonate, chloride, fluoride, iodide, nitrate, oxalate, oxide, perchlorate, sulfate, etc.

Er(erbium): acetate, bromide, carbonate $Er_2(CO_3)_3$, chloride, fluoride, iodide, isopropoxide$[(CH_3)_2CHO]_3Er$, nitrate, oxalate $Er_2(C_2O_4)_3$, oxide, perchlorate, sulfate, etc.

Eu(europium): acetate, bromide, carbonate, chloride, fluoride, iodide, nitrate, oxalate, oxide $Eu_2O_3$, perchlorate, sulfate, etc.

Fe (iron): acetate, bromide, chloride, citrate, fluoride, iodide, nitrate, oxalate, oxide, perchlorate, phosphate, sulfate, goethite, magnetite, hematite ($\alpha$-$Fe_2O_3$); iron acetylacetonate; sulfite; pentacarbonyl; hexacarbonyl; etc.

Ga(gallium): bromide $GaBr_3$, chloride, fluoride, iodide, nitrate, oxide, perchlorate, sulfate, etc.

Ge(germanium): bromide $GeBr_4$, chloride, ethoxide $Ge(OC_2H_5)_4$, fluoride, iodide, isopropoxide, methoxide, oxide, etc.

Gd(gadolinium): acetate $(CH_3CO_2)_3Gd$, bromide, carbonate, chloride, fluoride, hydroxide, iodide, nitrate, oxalate, oxide, perchlorate, sulfate, etc.

Ho(holmium): acetate, bromide, carbonate, chloride, fluoride, iodide, nitrate $Ho(NO_3)_3$, oxide, perchlorate, sulfate, etc.

In(indium): acetate, bromide $IBr_3$, chloride, fluoride, hydroxide, iodide, iospropoxide, nitrate, oxide, perchlorate, sulfate, etc.

K(potassium): acetate, carbonate, bromide, carbonate, chloride, citrate, fluoride, hydroxide, iodide, nitrate, oxalate, sulfate, etc.

La(lanthanum): acetate $(CH_3CO_2)_3La$, bromide, carbonate, chloride, fluoride, hydroxide, iodide, nitrate, oxalate, oxide, perchlorate, sulfate, etc.

Li(lithium): acetate, bromide, carbonate, chloride, hydroxide, iodide, nitrate, oxide, perchlorate, phosphate, sulfate, etc.

Lu(lutetium): acetate, bromide, carbonate, chloride, fluoride, iodide, nitrate, oxalate, oxide, perchlorate, sulfate, etc.

Mg(magnesium): acetate, bromide, carbonate, chloride, hydroxide, iodide, nitrate, oxide, sulfate, etc.

Mn(manganese): acetate $(CH_3CO_2)_2Mn/(CH_3CO_2)_3Mn$, bromide, carbonate, chloride, fluoride, iodide, nitrate, oxide, perchlorate, sulfate, etc.

Mo(molybdenum): acetate dimer $[(CH_3CO_2)_2Mo]_2$, bromide $MoBr_3$, chloride, fluoride, oxide $MoO_2$, etc.

Na(sodium): acetate, bromide, carbonate, chloride, citrate, fluoride, hydroxide, iodide, nitrate, oxalate, phosphate, sulfate, etc.

Nb(niobium): oxide, etc.

Nd(neodymium): acetate $(CH_3CO_2)_3Nd$, bromide, carbonate, chloride, fluoride, iodide, isopropoxide, nitrate, oxalate, oxide, perchlorate, sulfate, etc.

Ni(nickel): acetate, bromide, carbonate, chloride, fluoride, hydroxide, iodide, nitrate, oxalate, oxide, perchlorate, sulfate, etc.

Pb(lead): acetate, bromide, carbonate, chloride, iodide, oxide, perchlorate, sulfate, etc.

Pd(palladium): oxide $PdO$, propionate $(C_2H_5CO_2)_2Pd$, sulfate, etc.

Pt(platinum): oxide $PtO_2$, sulfide $PtS_2$, etc.

Pr(praseodymium): acetate, carbonate, chloride, isopropoxide, nitrate, oxalate, oxide, perchlorate, sulfate, etc.

Rb(rubidium): acetate $CH_3CO_2Rb$, bromide, carbonate, chloride, fluoride, hydroxide, iodide, nitrate, sulfate, etc.

Re(rhenium): chloride $ReCl_3$, fluoride, oxide, etc.

Rh(rhodium): acetate dimer $[(CH_3CO_2)_2Rh]_2$, chloride $RhCl_3$, nitrate, oxide, phosphate, sulfate, etc.

Ru(ruthenium): bromide, chloride $RuCl_3$, iodide, nitrosyl chloride $Ru(NO)Cl_3$, oxide, etc.

Sb(antimony): acetate $(CH_3CO_2)_3Nd$, bromide, butoxide, chloride, fluoride, iodide, isopropoxide, oxide, etc.

Si(silicon): oxide $SiO_2/SiO$, acetate $(CH_3CO_2)_4Si$, bromide, chloride, fluoride, etc.

Sm(samarium): acetate $(CH_3CO_2)_3Sm$, bromide, carbonate, chloride, fluoride, iodide, nitrate, oxalate, oxide, sulfate, etc.

Sr(strontium): acetate$(CH_3CO_2)_2Sr$, carbonate, chloride, hydroxide, iodide, isopropoxide, nitrate, oxalate, oxide, perchlorate, sulfate, etc.

Tb(terbium): acetate $(CH_3CO_2)_3Tb$, bromide, carbonate, chloride, fluoride, iodide, nitrate, oxalate, oxide, perchlorate, sulfate, etc.

Ti(titanium): bromide $TiBr_4$, butoxide $Ti[O(CH_2)_3CH_3]_4$, chloride, ethoxide, fluoride, iodide, isopropoxide, methoxide, nitrate, oxide $TiO_2$, oxysulfate $TiOSO_4$, propoxide, sulfate, etc.

Tm(thulium): acetate $(CH_3CO_2)_3Tm$, bromide, carbonate, chloride, fluoride, iodide, nitrate, oxalate, oxide, perchlorate, sulfate, etc.

V(vanadium): bromide, chloride $VCl_2/VCl_3/VCl_4$, fluoride, iodide, oxide, etc.

W(tungsten): bromide $WBr_5$, chloride, fluoride, oxide, oxychloride $WOCl_4$, sulfide $WS_2$, etc.

Y(yttrium): acetate $(CH_3CO_2)_3Y$, bromide, carbonate, chloride, fluoride, isopropoxide, iodide, nitrate, oxalate, oxide, perchlorate, sulfate, etc.

Yb(ytterbium): acetate $(CH_3CO_2)_3Yb$, bromide, carbonate, chloride, fluoride, iodide, isopropoxide, nitrate, oxalate, oxide, perchlorate, sulfate, etc.

Zn(zinc): acetate $(CH_3CO_2)_2Zn$, bromide, chloride, fluoride, iodide, lactate $[CH_3CH(OH)CO_2]_2Zn$, nitrate, oxalate, oxide, perchlorate, peroxide, sulfate, etc.

All of these methods can further comprise doping of the nanostructures with perovskites. Doping compounds are added to precursor mixtures.

Ternary Oxide Nanostructures Formed Using Templates

In one embodiment of the invention, ternary nanostructures are produced by using templates. Reagents of A are mixed with reagents of B in an aqueous solvent to form a precursor mixture.

For example, an aqueous bismuth reagent is mixed with an aqueous M-reagent, preferably with an aqueous reagent of a metal, more preferably with an aqueous reagent of a transitional metal. An aqueous solvent is added to the mixture to form a precursor mixture.

In another example, an aqueous iron reagent is mixed with an aqueous M'-reagent, preferably with an aqueous reagent of a metal, more preferably with an aqueous reagent of a transitional metal. An aqueous solvent is added to the mixture to form a precursor mixture.

Examples of suitable aqueous solvents include alkyl and alkylene glycols, such as, for example, ethylene glycol; water; mixtures of water and alcohols (such as primary alcohols including methanol, ethanol, and propanol in addition to secondary and tertiary alcohols); mixtures of water and acids, such as, for example, acetic acid, propionic acid, ethanoic acid, and/or nitric/sulfuric acid; and mixtures of ethylene glycol and acids, such as, for example, citric acid and/or tartaric acid. Solvents are selected according to the particular reagents used as would be known to a skilled artisan. For example, since pH control is important when using bismuth acetate, water/acetic acid is preferred as a solvent. When using bismuth oxide, water/nitric acid is preferred.

The molar ratios between the A reagent and the B reagent can be any ratio which provides the desired nanostructure. For example, the molar ratio between the A reagent and the B reagent, ranges from about 0.01:1 to 100:1. Other examples include about 50:1, preferably, 20:1, even more preferably, 5:1, most preferably 3:1, and optimally, 1.5~2:1.

Preferably, an excess amount of the bismuth reagent is added in order to compensate for bismuth evaporation. For example, the molar ratio of the bismuth reagent to the M-reagent include about 50:1, preferably, 20:1, even more preferably, 5:1, most preferably 3:1, and optimally, 1.5~2:1.

Similarly, the molar ratios between the iron reagent and the M'-reagent can be any ratio which provides the desired nanostructure. Preferably, excess amounts of the M'-reagent is added. Examples of the molar ratio of the M'-reagent to the iron reagent include about 50:1, preferably, 20:1, even more preferably, 5:1, most preferably 3:1, and optimally, 1.5~2:1.

The precursor mixture is stirred while heating for a period of time that would allow for a transparent sol comprising ternary oxide nanostructure precursors to form. For example, the mixture can be heated to about 60 to about 90° C. Generally higher temperatures require a shorter reaction time and lower temperatures require a longer reaction time. There are optimal temperatures for each reaction, as would be known to a skilled artisan. For example, the optimal temperature to form the multiferroic bismuth ferrite is approximately 80° C. The sol can be recovered upon evaporation of the excess solvent.

Droplets of the sol are then deposited onto a porous template surface with application of pressure to force the precursors into the pores. Pressure can be applied mechanically or gravitationally. For example, pressure can be applied by means of vacuum filtration. Preferably, pressure is applied by a pressure-filter technique as described in Steinhart et al., *Science*, 2002, 296: 1997 and Ai et al., *J. Am. Chem. Soc.*, 2003, 125:11140, both incorporated herein by reference in their entireties.

Examples of templates include "track-etch" polymeric membranes; copolymer templates; Teflon membranes; zeolites, and porous alumina or silica membranes (including Anodisc membranes).

Track-etch membranes contain randomly distributed nanochannels (i.e., pores) of uniform diameter (as small as 10 nm). Pore densities approach $10^9$ pores/cm$^2$. These commercially available membranes are usually prepared from either polycarbonate or polyester.

Alumina membranes have dimensions of the pores which are tunable in the range of 4 to several hundred nanometers. Pore densities as high as $10^{11}$ pores/cm$^2$ can be obtained, and typical membrane thickness can range from 10 to 100 μm. Preferred templates are porous anodic alumina (AAO) templates. The AAO templates have a porosity of 40 to 65%.

Silicon templates are obtained by electrochemical etching of silicon wafers. The resulting porous structures has a thin nanoporous layer (with pore diameters of as small as 3 nm) on top of macroporous layer.

The pore sizes of the templates are varied according to the desired dimensions and characteristics of the resultant nanostructures. For example, pore sizes can range from about 3 nm to about 1000 nm, preferably from 20 nm to several hundred nanometers. As the pore size increase to a certain maximum level, nanostructures become straighter and smoother with fewer extraneous particulate debris. The resultant nanostructures typically have diameters which are approximately 20 to 80% larger than the reported pore size of the template. For example, using a template with 200 nm pores produces nanotubes and nanorods having an outer diameters in the range of 240 to 300 nm. The lengths of the nanotubes and nanorods range from several microns to the entire length of the template membranes.

Varying the conditions of the synthesis also affects the dimensions and characteristics of the resultant nanostructures. For example, as the duration of sol deposition increases, a greater portion of each pore is filled with the precursors. The precursors first attach to the inner perimeters of the walls of the pores. As deposition time passes, additional precursor layers form.

If the desired resultant nanostructures are nanotubes, then the duration of deposition is stopped before the precursors are allowed to fill the entire pore volume. The thickness of the walls of the nanotubes increases as the duration of deposition increases. If the desired resultant nanostructures are nanorods, then the duration of desposition is allowed to proceed until the precursors fill the whole pore volume.

Also, for example, as the viscosity of the sol increases, the mobility of the precursors decrease. Accordingly, the time for filling the pores decreases. Thus, thicker nanotube walls are formed. Also, the time needed to generate nanorods is shortened.

The templates containing the ternary oxide precursors are dried by methods that would be known to a skilled artisan to form the product containing nanostructures. For example, they can be vacuum oven-dried at approximately 80 to 120° C. for about fifteen minutes to two hours. Preferably, the product is then purified as would be known by a skilled artisan in order to get rid of excess hydrocarbons and $NO_x$ impurities. Also, preferably, the product is further annealed.

The template is removed from the product by immersion in a base solution as would be known by a skilled artisan. For example, the template can be removed by immersion in NaOH solution at room temperature for 24 h. Thereafter, to retrieve the nanostructures, the base solution is diluted in several steps with distilled water and an organic solvent. Nanostructures can then be collected by centrifugation or filtration.

Ternary Oxide Nanostructures Formed Using Molten Salt Technique

In another embodiment of the invention, ternary nanostructures are produced by using a molten salt technique. Reagents of A are mixed with reagents of B in the presence of a surfactant and a salt to produce nanostructures.

For example, a bismuth reagent is mixed with a M-reagent, preferably with a reagent of a metal, more preferably with a reagent of a transitional metal, in the presence of a surfactant and a salt to produce nanostructures.

In another example, an iron reagent is mixed with an M'-reagent, preferably with an reagent of a metal, more preferably with a reagent of a transitional metal, in the presence of a surfactant and a salt to produce nanostructures.

In a further example, a barium reagent is mixed with a chromium reagent or a tungsten reagent to form $BaCrO_4$ and $BaWO_4$, respectively.

Any type of surfactant can be used in this method. Preferably, non-ionic surfactants are used. Non-ionic surfactants are known in the art. Examples of non-ionic surfactants can be found, for instance, in "Non-ionic Surfactants: Organic Chemistry," edited by Nico M. van Os, published by Marcel Dekker (1998), and "Non-ionic Surfactants: Chemical Analysis (Surfactant Science Series, Vol 19)" by John Cross, published by Marcel Dekker (Oct. 1, 1986). Some non-ionic surfactants can be divided into classes depending on the type of hydrophilic group appearing in the surfactant.

Two classes of non-ionic surfactants that comprise poly(ethylene oxide) groups as their hydrophilic groups are alcohol ethoxylates and the alkylphenol ethoxylates. Examples of non-ionic surfactants of these classes include polyoxyethylene-9-nonylphenyl ether; tetraethylene glycol monododecyl ether; polyoxyethylene 23 glycol monododecyl ether; polyethylenoxide-polypropylenoxide (PEO-PPO) block-copolymers (such as the commercially available PEO-PPO-PEO triblockcopolymers, called Synperonics F108 and F127), polyoxyethylene alkylphenols; polyoxyethylene alcohols; polyoxyethylene esters of fatty acids; polyoxyethylene mercaptans; and polyoxyethylene alkylamines.

Another class of non-ionic surfactants is the alkyl polyglycosides. In these molecules, the hydrophilic group is a sugar molecule, such as a polysaccharide, disaccharide, trisaccharide, maltose, etc. Preferably, the polyglycosides have one or two sugar groups in their chains. Examples of non-ionic surfactants of this class include alkyl glucoside and a glucose ester.

Another class of non-ionic surfactants is sorbitan ester surfactants. Examples of non-ionic surfactants of this class include polysorbate 20 (i.e. polyoxyethylene (20) sorbitan monolaurate, sold as Tween 20™); polysorbate 60 (i.e. polyoxyethylene (60) sorbitan monostearate); polysorbate 80 (i.e. polyoxyethylene (20) sorbitan monooleate); and polysorbate 65 (i.e. polyoxyethylene (20) sorbitan tristearate).

Examples of suitable salts include sodium chloride, sodium sulfate, sodium sulfide, sodium carbonate, sodium acetate, sodium amide, sodium benzoate, sodium bifluoride, sodium borate, sodium bisulfite, sodium bicarbonate, sodium bromide, sodium bromate, sodium butyrate, sodium carbonate, sodium chlorate, sodium chlorite, sodium chromate, sodium citrate, sodium cyanate, sodium dichloroacetate, sodium dichromate, sodium deuteroxide, sodium dihydrogen phosphate, sodium dihydrogen citrate, sodium dihydrogen pyrophosphate, sodium ethoxide, sodium fluoborate, sodium fluoride, sodium formate, sodium fumarate, sodium gluconate, sodium hexametaphosphate, sodium hydrogen carbonate, sodium hydrogen phosphate, sodium hydrogen sulfate, sodium hydrogen tartrate, sodium iodide, sodium hypochlorite, sodium iodoacetate, sodium metabisulfite, sodium methoxide, sodium nitrate, sodium nitrite, sodium oxalate, sodium perborate, sodium perchlorate, sodium periodate, sodium permanganate, sodium phenolate, sodium polyphosphate, sodium propionate, sodium sulfate, sodium sulfite, sodium tetraborate, sodium sulfate decahydrate, sodium tetrafluoroborate, sodium thiosulfate, sodium p-toluenesulfonate, sodium trichloroacetate, sodium tripolyphosphate, and sodium trifluoroacetate.

Preferably, the A reagent is thoroughly mixed with the B reagent and a salt. For example, the bismuth reagent is thoroughly mixed with the M-reagent and a salt. Alternatively, preferably, the iron reagent is thoroughly mixed with the M'-reagent and a salt. To this mixture, a surfactant is added. The components can be mixed in any order.

The resulting mixture is preferably ground and then sonicated. The mixture is then heated to an annealing temperature as would be known to a skilled artisan. An example of a temperature range is about 300 to about 1600° C. For example, the mixture can be placed in a ceramic crucible, inserted into a quartz tube, heated at a ramp rate of about 5° C. per minute up to an annealing temperature of about 820° C. Heating takes place for about 1 to about 5 hours, as would be known to a skilled artisan.

The mixture is then cooled to room temperature to yield a product. Upon cooling, preferably, the product is washed several times. For example, the product can be washed alternatively with water and an acid, such as, for example, nitric acid. The nanostructures are collected from the product, for example by centrifugation, and dried, as would be known to a skilled artisan.

The stoichiometric amounts of the A reagent and the B reagent depends upon the desired nanostructure to be formed. For example, the molar ratios of the A reagent and the B reagent can range from about 1:1 to about 100:1, For example, the stoichiometric amounts of the bismuth reagent and the M-reagent depends upon the desired nanostructure to be formed. The molar ratios of the bismuth reagent and the M-reagent can range from about 1:1 to about 100:1, preferably about 1:1 to about 10:1. The molar ratios of the M'-reagent and the iron reagent can range from about 1:1 to about 100:1, preferably about 1:1 to about 10:1. Although use of different molar ratios dissimilar morphologies, the crystallinity of the end products is almost identical.

As the ratio of a bismuth reagent to a M-reagent is increased, the nanostructures increase in size, in particular, in their length. For example, a 1:1 molar ratio of a bismuth compound to a transitional metal oxide yields particles with cubic-like features. The sides of cubic-like structures typically measure from about 1 nm to about 10 μm, or about 50-80 nm. The average size of a side of an orthorhombic cube is about 350 nm.

Whereas, a 3:1 molar ratio of a bismuth compound to a transitional metal precursor (such as the oxide) yields orthorhombic structures. The widths of these structures measure about the same as a side of the cubic-like structures. However, the lengths of the orthorhombic structures tend to be at least about twice as long as their widths.

A 6:1 molar ratio of a bismuth compound to a transitional metal oxide yields mostly straight and rod-like structures.

The lengths of the rods are about ten times as long as the lengths of the orthorhombic structures. The widths of these structures are about twice as long as the widths of the orthorhombic structures.

Similarly, as the ratio of an M'-reagent to an iron-reagent is increased, the nanostructures increase in size, in particular, in their length.

Additionally, as the ratio of the bismuth compound to a transitional metal oxide is increased, the nanostructures develop more irregularities. For example, the cube-like structures generally exhibit relatively sharp edges. Whereas, the orthorhombic structures exhibit some slightly truncated corners or edges. And the rod-like structures exhibit some degree of fracture and fragmentation.

The addition of a surfactant allows for a more homogeneous production of nanostructures. That is, without a surfactant, there is no selectivity in terms of nanostructure shape, regardless of the molar ratio of the reagents. As the molar ratio of the reagents is varied, the stoichiometric amount of the surfactant is varied as would be known by a skilled artisan. Also, guidance is provided in McCutcheon's Emulsifiers & Detergents, Vol. 1, North American Edition and Yin et al., *J. Mater. Res.* 19:1208 (2004); Leonard et al., *Langmuir* 19:5484 (2003), all incorporated herein by reference. Additionally, the surfactant inhibits interparticle aggregation.

The presence of salt decreases the viscosity of the mixture. As viscosity decreases, the mobility of the precursors increases. The increase of mobility increases the solubility of the precursors in a molten salt. In addition, the increase of mobility helps the formation of the perovskite-type phase (through the nucleation and growth process) when further heating. Variations of the parameters in a molten salt method can be found in Wiley, J. B.; Kaner, R. B., *Science*, 1992, 255, 1093, and Yoon et al., *J. Mater. Sci.*, 33, 2977 (1998), both incorporated herein by reference. Additionally, salt allows for the production of nanostructures with a higher degree of purity.

Examples of stoichiometric amounts of the A reagent, the B-reagent, the surfactant, and the salt include molar ratios of about 1:1:40:6; about 3:1:40:6; and about 6:1:40:6, respectively.

Examples of stoichiometric amounts of the bismuth reagent, the M-reagent, the surfactant, and the salt include molar ratios of about 1:1:40:6; about 3:1:40:6; and about 6:1:40:6, respectively.

Examples of stoichiometric amounts of the M'-reagent, the iron-reagent, the surfactant, and the salt include molar ratios of about 1:1:40:6; about 3:1:40:6; and about 6:1:40:6, respectively.

Molten Salt Technique Including Doping with Perovskites

In a further embodiment of the molten salt technique, the method yields nanostructures which include perovskites.

By this doping method, $(1-x)ABO_3-x$(alkaline earth metal)$TiO_3$ nanostructures with $x=0, 0.1, 0.3, 0.5$ and 1, spanning four distinct regions of the solid solution phase diagram, are formed For example, $(1-x)BiMO_3-x$(alkaline earth metal)$TiO_3$ nanostructures with $x=0, 0.1, 0.3, 0.5$ and 1, spanning four distinct regions of the solid solution phase diagram, are formed. For instance, $(1-x)BiFeO_3-x\ BaTiO_3$ nanostructures are formed. The composition of the resulting nanostructures is tunable by adjusting the ratio of the reagents, as described above.

The perovskite nanostructures, of which barium titanate cited above is an example, are single crystalline compositions of matter. The perovskite nanostructures of the present invention have a structural formula $ABO_3$ wherein B is at least one metal selected from Group IIIA, IVA, IVB, VB, VIB, VIIB, or VIIIB of the Periodic Table of Elements (CAS version), and A is at least one additional cation having a positive formula charge of from about 1 to about 3.

In the above formula, component A of the perovskite nanostructure comprises a cation selected from the group consisting of K, Na, Rb, Cs, Li, Ba, Sr, Zr, Ta, La, Pb, Zn, Ca, Sc, Y, Bi, an element from the Lanthanide-series, an element from the Actinide-series, and mixtures thereof. In the present invention, it is preferred that component A of the perovskite nanostructure is a cation of Ba and/or Sr.

Insofar as component B of the perovskite nanostructure is concerned, component B may include any metal within the group of metals listed above. Thus, for example, the B component of the perovskite nanostructure may include a metal such as, for example, Ti, Zr, Hf, V, Nb, Ni, Fe, Co, Ta, Cr, Mo, W, Mn, Tc, Re, Ge, Sn, Ru, Os, Cd, Hg, Rh, Ir, Pd, Pt, Cu, Bi, I, Al, Ce, Th, and/or In. Of these metals, it is preferred that Ti be used as the B component of the perovskite nanostructure of the present invention.

When Ti is employed as the B component in the above formula, titanate-based perovskites having the formula $ATiO_3$ are synthesized. Examples of such types of titanate-based nanostructures that may be formed in the present invention include, but are not limited to: barium strontium titanate $(Ba_xSr_{1-x})TiO_3$; BSTO), barium titanate ($BaTiO_3$; BTO), strontium titanate ($SrTiO_3$; STO), calcium strontium titanate $(Ca_xSr_yTi_zO_3)$ lead zirconium titanate $(Pb(Zr_yTi_{1-y})O_3$; PZTO), barium zirconium titanate $(Ba(Zr_yTi_{1-y})O_3$; BZTO), and lead lanthanum titanate $((Pb_{1-x}La_x)TiO_3$; PLTO). Of the foregoing mentioned titanate-based nanomaterials, it is preferred in the present invention that the perovskite nanostructures formed comprise barium titanate, $BaTiO_3$ or strontium titanate, $SrTiO_3$. In one embodiment of the present invention, it is preferred that the nanowires are comprised of $BaTiO_3$. In yet another embodiment of the present invention, it is preferred that the nanostructures are comprised of $SrTiO_3$.

The perovskite nanowires are one-dimensional structures that are completely filled nanomaterials. The perovskite is present entirely throughout the nanowire; therefore no interfaces exist in the inventive nanowires. The perovskite nanowires of the present invention are characterized as having a diameter from about 50 nm to about 80 nm and a length, 1, from about 1.5 μm or greater. More preferably, the perovskite nanowires of the present invention have a diameter from about 30 nm to about 150 nm, or from 40 nm to about 120 nm, and a length, 1, from about 0.1 μm to about 50 μm, or 1 μm to about 50 μm.

The perovskite nanowires of the present invention are further characterized as having an aspect ratio on the order of about 5 or greater, with an aspect ratio of about 10 to about 1000 being more highly preferred. The aspect ratio (AR) of a two-dimensional shape is the ratio of its longer dimension to its shorter dimension. The inventive perovskite nanowires also are characterized as having a cubic crystalline structure that has substantially no amorphous impurities therein. The nanowires however contain a very thin (on the order of about 1 nm or less) amorphous carbon surface layer. In accordance with the present invention, the nanowires synthesized by the present invention have an amorphous impurity content of less than 1%. The nanowires of the present invention are further characterized as having no defects or dislocations and having an extremely smooth outer surface. By "extremely smooth," it is meant a surface that has a mean square roughness value of less than about 0.5 nm RMS (root mean square) or less. Another characteristic feature of the nanowires is that their outer surfaces contain amorphous carbon with essentially little or no groups that are oxygenated, e.g., COOH and OH. The presence of carbon as well as the absence of the surface oxygenated groups can be verified by IR spectroscopy, X-ray photoelectron spectroscopy or by using any other surface elemental analysis technique.

The nanocubes of the present invention have an edge length from about 70 nm to about 90 nm, with an edge length of about 80 nm being more typical. The nanocubes of the present invention have all the basic characteristics of the inventive nanowires, except for the dimensions mentioned above.

The nanostructures of the present invention are prepared using a facile solid-state reaction which begins by first providing a reaction mixture that includes at least a metal oxide nanostructural template, a metal oxalate precursor compound comprising a metal having a positive formula charge of 1 to 3, a surfactant and a salt that is non-reactive with the metal oxide nanostructural template and the metal oxalate precursor. The reaction mixture is prepared by adding the aforementioned components together in a reaction vessel or flask, and then mixing the added material together. The addition of the various components can be in any order and the mixing step can be performed utilizing techniques that are well known to those skilled in the art. For example, the mixing step can be performed utilizing a conventional blender, a mechanical grinder such as a mortar and pestle setup, or other like mixing apparatus. During the mixing process, a homogeneous solid-state reaction mixture is provided and, in some instances, the components of the reaction mixture are typically ground into smaller particles than that of the particle size of the initially added components.

The metal oxide nanostructural template employed in the present invention comprises a metal selected from Group IIIA, IVA, IVB, VB, VIB, VIIB, or VIIIB of the Periodic Table of Elements. Of the various metals that may be employed in the present invention, it is highly preferred that the metal oxide nanostructural template be $TiO_2$. Because the metal oxide nanostructural template provides the B component of the inventive perovskite nanocubes and nanowires, the inventive perovskite nanostructures can have many of the physical properties of the metal oxide nanostructural template. Hence, the length and diameter of the inventive perovskite nanowires can be derived from the length and diameter of the nanostructural template. As such, the nanostructural template is employed as a precursor material itself in order to generate the corresponding perovskite nanostructures in a controlled and rational manner.

Thus, there is at least one precursor compound employed in the present invention comprising a cation having a positive formula charge of 1 to 3 and an oxalate anion. Preferred examples of such precursor compounds include barium oxalate and/or strontium oxalate.

The salt employed in forming the reaction includes any salt that does not react with the nanostructural template or the oxalate-containing precursor compound. Examples of such salts include alkali halides, alkali nitrates, alkali phosphates and mixtures thereof. The term "alkali" denotes an alkali metal from Group IA of the Periodic Table of Elements, including, for example, Li, Na, K, Rb, and the like. Preferably, the alkali comprises either Na or K. The term "halide" denotes F, Cl, Br and I. In one preferred embodiment, the alkali halide is NaCl.

The surfactant employed in the present invention comprises any surfactant that can serve as an emulsifying agent for the nanostructural template and the precursor. Illustratively, the surfactant can be a cationic surfactant, an anionic surfactant, an amphoteric, i.e., zwitterionic, surfactant, a non-ionic surfactant or any combination thereof.

Examples of the cationic surfactants that can be used in the present invention, include, but are not limited to, cetyltrimethylammonium bromide and the like. Examples of anionic surfactants that can be employed in the present invention include, but are not limited to: sodium dioctyl sulfosuccinate and the like. Examples of the amphoteric surfactants that can be used in the present invention, include, but are not limited to: alkyl ampho(di)acetates and the like. Examples of non-ionic surfactants that can be used in the present invention, include, but are not limited to: alkyl aryl ether and the like. Of the various type of surfactants mentioned above, it is preferred that nonionic surfactants such as an alkyl aryl ether be employed. In one embodiment, the alkyl aryl ether is nonylphenyl ether. The foregoing surfactants are provided for illustrative purposes and the present invention is not limited to the surfactants listed above. An exhaustive list of various surfactants that can be used in the present invention can be found in McCutcheon's Emulsifiers & Detergents, Vol. 1, North American Edition.

The admixing of the various components is performed at nominal room temperature (on the order of about 15°-40° C.). The molar ratio of metal oxide to the metal oxalate precursor compound used in forming the perovskite nanoparticles is from about 0.1:1 to about 10:0.1, or from about 0.9:1 to about 1:0.9, with an optimal molar ratio of about 1:1, based on the metal oxide nanostructural template to the metal oxalate precursor compound, being more highly preferred.

The molar ratio of salt to precursor compound is from about 1:1 to about 100:1, or from about 5:1 to about 50:1, with a molar ratio of salt to precursor of about 20:1 being more highly preferred. The molar ratio of the surfactant used in preparing the nanoparticles of the present invention to precursor is from about 1:1 to about 10:1, or from about 1:1 to about 8:1, with a molar ratio of surfactant to precursor of about 3:1 being more highly preferred.

After the admixing step, the reaction mixture is subjected to sonication. Any conventional sonication apparatus can be used to sonicate the admixture. The sonication typically occurs at nominal room temperature in air. The sonication step is typically performed for a time period from about 1 to about 30 minutes, or from about 1 to about 20 minutes, with a time period from about 4 to about 8 minutes being more typical.

The reaction mixture is then heated, i.e., annealed, in air at a temperature from about 810° C. to about 835° C. to facilitate the growth and formation of the perovskite nanowires and/or nanocubes. More specifically, the temperature of this heating step is from about 815° C. to about 825° C. The heating step occurs in a quartz crucible, which is inserted in a quartz tube.

The heating step is performed for a time period that is sufficient to continue the formation of perovskite nanostructures in the reaction vessel. Typically, the heating step is performed for a time period from about 0.5 hour to about 10 hours, with a time period from about 2 hours to about 4 hours being more highly preferred.

After the heating step, the sample is cooled to nominal room temperature and the inventive nanostructures are recovered using techniques well known to those skilled in the art including, for example, collection of nanostructures via centrifugation, washing the collected nanostructures with distilled water and drying. The yield of perovskite nanostructures recovered from the inventive process is typically on the order of about 80% or greater, with a yield of from about 90% to about 95% being more typical. Possible side products from the barium titanate nanowire synthesis include barium titanate nanocubes as well as barium titanate nanoparticles.

Small traces of amorphous carbon, less than 1%, as well as unreacted starting materials, less than 2%, may be present in the final nanostructure product.

Ternary Oxide Nanostructures Formed Using Sol-Gel Technique

In another embodiment of the invention, ternary oxide nanoparticles are produced using a sol-gel technique. Reagents of A are mixed with reagents of B and a solvent to form a precursor mixture.

For example, a bismuth reagent is mixed with a M-reagent and a solvent to form a precursor mixture. Preferably, a bismuth nitrate hydrate reagent, and a reagent comprising a nitrate hydrate of a M-compound are mixed in a glycol solvent. In another embodiment, an iron reagent is mixed with an M'-reagent in a solvent to form a precursor mixture. Preferably, the M-reagent and the M'-reagent are metals, and more preferably are transitional metals. Examples of suitable aqueous solvents are defined above.

The precursor mixture is heated and/or stirred until a transparent sol is formed. A sol is an oxide species formed from the reagents undergoing hydrolysis and condensation during heating and/or stirring.

The molecular weight of the oxide species continuously increases with heating and/or stirring. As these species grow, they link together in a three-dimensional network. The point in time at which the network of linked oxide particles spans the container holding the sol is the gel point. At the gel point, the mixture forms a rigid substance called an alcogel. An alcogel consists of two parts, a solid part (i.e., the xerogel) and a liquid part. The solid part is formed by the three-dimensional network of linked oxide particles. The liquid part is the solvent which fills the free space surrounding the solid part. After the liquid part of an alcogel is removed, the xerogel remains. Removal can be accomplished by methods that are known in the art, such as, for example, evaporation and supercritical extraction. Preferably, the xerogel retains its original shape and at least 50% (typically >85%) of the alcogel's volume.

The xerogel is preheated to a temperature of about 200 to about 600° C., such as, for example, about 400° C., in order to remove excess hydrocarbons and $NO_x$ impurities.

Spherical and semi-spherical nanoparticles are formed. The size of the nanoparticles can be controlled by annealing the xerogel. As the annealing temperature is increased, the size of the nanoparticles increase. For example, the xerogels can be annealed at 400, 450, 500, 550, 600, 650, 700 and 800° C. After the annealing, the product is formed. The product is then ground, washed with distilled water with an application of sonication, and collected by centrifugation.

Nanotubes can also be formed using the sol-gel technique. The mixture containing the reagents and the solvent (i.e. precursor mixture) is placed onto a template before heating. The templates can have aligned pores, such as those described above. Alternatively, the templates do not have aligned pores.

Mesoporous silica are prepared by a sol-gel process from tetraethoxysilarie (TEOS) hydrolysis followed by the calcination of a soft material called an alcogel. Silica xerogels have a high porosity (90% or higher) and high surface area (800-1000 $m^2/g$), an ideal matrix for the chemical vapor infiltration of a desired material on an extremely fine scale. In addition, the zeolite-realted aluminophosphates VPI-5, aluminosilicates MCM-41, MCM-42, and zeolite Y could be used as microporous inorganic host materials.

It is noted that throughout the present specification various components are mixed and/or stirred and/or mixed and/or heated. The addition of the various components can be in any order and the stirring, mixing and/or heating steps can be performed utilizing techniques that are well known to those skilled in the art. For example, the mixing step can be performed utilizing a conventional blender or other like mixing apparatus.

Examples of Some Applications of the Nanostructures of the Present Invention

The nanostructures of the present invention possess spontaneous polarization, magnetization, and piezoelectricity that can be switched on by an applied electric field, magnetic field, and elastic force or stress, respectively. These nanostructures can be used for the design of nanoscale building blocks for soft magnetic materials with applications in transformers and inductors.

The nanostructures of the present invention can be used in numerous molecular electronic applications such as, for example random access memory, field effect transistors, electromechanical devices, logic circuitry, pyroelectronic detectors, imaging detectors, optical memories, modulators, deflectors, transducers, actuators, and high dielectric constant dielectrics. Additionally, the inventive nanostructures can be used for ferroelectric random access memory (FRAM) with a 1-Gbit density or higher and logic circuitry—the next generation of components for molecular electronics and molecular computers. Ferroelectric materials such as, for example, $BaTiO_3$ and $SrTiO_3$ have been under intensive investigation because of the prospect that their stable polarization states can be used to encode the 1 and 0 of Boolean algebra, which forms the basis of memory and circuitry.

Illustrative examples of structures in which an assembly of the inventive nanostructures can be employed, include, for example, dynamic random access memory (DRAM), field-effect transistors, electromechanical devices, logic circuitry, nanotransducers, nanoactuators, positive temperature coefficient resistors, multilayer capacitors, electo-optical devices, ferroelectrics, relaxors, and thermistors. Additionally, the nanostructures of the present invention can be employed in nonvolatile memory cells and electrochemical devices.

EXAMPLES

Example 1

Synthesis of $BiFeO_3$ Nanotubes Using a Template $Bi(NO_3)_3.5H_2O$ and $Fe(NO_3)_3.9H_2O$ with a molar ratio of 1:1 were added successively to ethylene glycol as described in Wada et al., *Mater. Sci. Eng.*, 1996, A217/218, 414. and Toshimitsu et al., *J. Phys. Chem. Solids*, 2003, 64:391, incorporated herein by reference in their entireties. The resulting mixture was stirred at 80° C. for 1 h, after which a transparent sol was recovered upon evaporation of the excess ethylene glycol. Droplets of the sol were deposited using a syringe onto a porous anodic alumina (AAO) template (Whatman Anodisc®) surface with application of pressure (as described in Steinhart et al., *Science*, 2002, 296:1997, incorporated herein by reference in its entirety). AAO membranes with different pore sizes, such as 200 nm and 100 nm, were used.

The resultant samples, i.e., AAO templates containing the $BiFeO_3$ precursors, were subsequently oven-dried at 100° C. for an hour, and then preheated to 400° C. for three separate runs at a ramp-rate of 5° C./min in order to get rid of excess hydrocarbons and $NO_x$ impurities. The sample was further annealed at 600° C. for 30 min. $BiFeO_3$ NTs were isolated after the removal of AAO template, following its immersion in 6M NaOH solution at room temperature for 24 h. Thereafter, to retrieve reasonable quantities of nanotubes, the base solution was diluted in several steps with distilled water and lastly ethanol. Tubes were collected by centrifugation.

In order to overcome the lack of wettability of the template by the sol, a pressure-filter technique was employed to force reagents into the pores (Steinhart et al., *Science*, 2002, 296: 1997 and Ai et al., *J. Am. Chem. Soc.*, 2003, 125:11140, incorporated herein by reference in their entireties). Hence, the nature of the wetting of the precursor sol on the inner surface of the template membrane likely had a substantial effect on the morphology of the final products. For example, the duration of sol deposition as well as the viscosity of the sol itself are all important factors in considering interactions of sol constituents with the template membranes (Steinhart et al., *Angew. Chem. Int. Ed.*, 2004, 43 :1334, incorporated herein by reference in its entirety) That is, the difference in morphology of the tubes synthesized in 100 vs. 200 nm pore-sized templates could have arisen not only from differential chemical interactions of the various sol constituents deposited with the pore walls themselves but also from contrasting geometric configurations of the sol constituent molecules within each individual template membrane, induced by spatial constraints. Moreover, as the nucleation of the $BiFeO_3$ particles likely starts from the sites randomly located on the wall of the template, the net effect would be formation of polycrystalline $BiFeO_3$ NTs, consistent with the SAED and HRTEM results observed.

$BiFeO_3$ NTs Characterized by XRD, SEM, TEM, HRTEM, EDX and SAED

FIG. 1 shows scanning electron microscopy (SEM) images revealing the morphologies of $BiFeO_3$ NTs. FIGS. 1A and 1B illustrate as-prepared $BiFeO_3$ NTs, grown in AAO membranes having 200 nm and 100 nm sized pores, respectively. The micrographs show dispersed individual $BiFeO_3$ NTs as well as some degree of NT bundling. It is evident that $BiFeO_3$ NTs generated from AAO membranes having pore size of 200 nm (FIG. 1A), mainly consist of straight and smooth structures with relatively few extraneous particulate debris. These tubes have outer diameters in the range of 240 to 300 nm, with lengths ranging from several microns to as much as 50 µm, corresponding to the entire length of the template membranes used.

In the case of $BiFeO_3$ NTs generated from 100 nm diameter pores (FIG. 1B), the lengths of the NTs are not only understandably shorter but also more irregular and polydisperse. Their lengths attain several microns at best with diameters in the range of 140 to 180 nm. Tubular morphologies show a higher degree of roughness, as compared with those of $BiFeO_3$ NTs possessing larger diameters. The larger diameters of NTs can be ascribed to larger internal diameters than surface ones of AAO membranes used (Steinhart et al., *Science*, 2002, 296:1997 and Ai et al., *J. Am. Chem. Soc.*, 2003, 125:11140).

Figure 2:
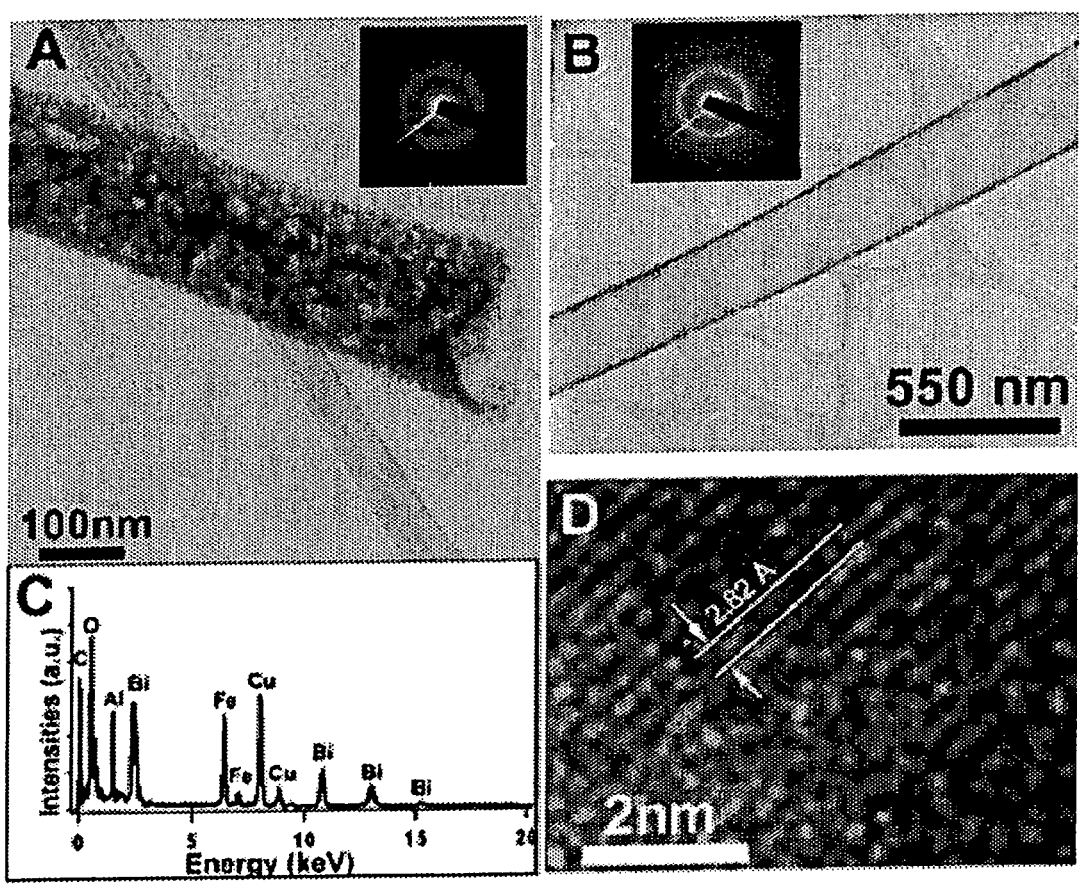
FIG. 2. TEM images of individual $BiFeO_3$ nanotubes (NTs) prepared in alumina membranes with 100 nm (A) and 200 nm (B) diameter pores, respectively. Insets of (A) and (B) are the corresponding SAED patterns of the individual NTs, respectively. (C) EDX data indicate that this individual NT is composed of Bi, Fe, and O and contains an Al impurity. The Cu and C peaks originate from the TEM grid. (D) HRTEM image of $BiFeO_3$ NTs generated from a template having 200 nm diameter pores.

FIGS. 2A and 2B illustrate transmission electron microscopy (TEM) images of an individual NT, generated from the alumina membrane with 100 nm and 200 nm diameter pores, respectively. The diameters are consistent with measurements from SEM data. EDX data (FIG. 2C) show the expected elemental signals of NTs arising from Bi, Fe, and O. Varying intensities of Al peaks have been observed, and are ascribed to residue from the template. Even though both of the tubes have similar levels of Al layers on their surfaces, the discrepancies between the morphologies of each tube can be clearly seen. FIG. 2B shows straight and relatively smooth structures; while FIG. 2A shows straight but relatively rough and irregular structures. The wall thickness for a $BiFeO_3$ NT obtained from the template with 200 nm diameter pores was ~10 nm (FIG. 2B). Analogous measurements for the $BiFeO_3$ NT generated from 100 nm diameter pores could not be properly obtained due to the roughness of the tube surface (FIG. 2A). Precedence for the observation of this type of morphology has been found with $Co_3O_4$ fibers synthesized using a sol-gel process (Lakshmi et al., *Chem. Mater.*, 1997, 9:857).

Selected area electron diffraction (SAED) data taken from each individual $BiFeO_3$ NT show identical ring patterns. The broad continuous ring patterns in the insets of FIGS. 2A and 2B show that the generated $BiFeO_3$ NTs consist of polycrystalline as well as amorphous states. HRTEM images further confirm the crystalline nature and composition of the as-prepared NTs. FIG. 2D shows a typical crystalline domain with an interplanar spacing of about 2.82 Å, which corresponds to the (110) ring in the SAED spectrum.

The purity and crystallinity of both the $BiFeO_3$ bulk and NT samples were examined using powder XRD. (See FIG. SI, part A, which can be found at http://www.rsc.org/suppdata/cc/b4/b409988e/b409988e.pdf, incorporated herein by reference in its entirety). Very few if any impurity peaks were present in the bulk samples, prepared by an identical experimental protocol. Peaks can be indexed to the rhombohedral structure of $BiFeO_3$ which is in good agreement with literature results (i.e., JCPDS#20-0169). The XRD pattern of $BiFeO_3$ NTs is also shown for comparison and is in agreement with bulk and reference data.

Since the template synthesis method produces relatively small amounts of confined nanostructures for XRD, data for the $BiFeO_3$ NTs were obtained indirectly (Figure SI, part B, found in http://www.rsc.org/suppdata/cc/b4/b409988e/b409988e.pdf, incorporated herein by reference in its entirety) by subtracting the signal due to the alumina template from that of the template/$BiFeO_3$ sample itself.

Example 2

Synthesis of $Bi_2Fe_4O_9$ Nanocubes Using Molten Salt Technique

Bismuth(III) oxide (Aldrich, 99.99%), iron(III) oxide (Aldrich, nanopowder), and Igepal® CO-630 or NP-9 surfactant (polyoxyethylene(9)nonylphenyl ether, Aldrich) were used as supplied. The choice of this surfactant was governed by its relative non-toxicity and facility of use. Stoichiometric amounts of $Bi_2O_3$, $Fe_2O_3$, NP-9, and NaCl were mixed (in molar ratios of 1:1:40:6, 3:1:40:6, and 6:1:40:6, respectively, for generation of varying structural motifs), thoroughly ground in an agate mortar, and sonicated.

In a typical synthesis of $Bi_2Fe_4O_9$ cubes, 0.5 mmol each of $Bi_2O_3$ and $Fe_2O_3$ along with 20 mmol of NaCl were mixed thoroughly, to which 2 ml of NP-9 was subsequently added. The resulting mixture was ground for at least 30 min prior to sonication for an additional 5 min. Identical procedures were employed for samples containing different molar ratios of initial precursors. The processed mixture was ultimately placed in a ceramic crucible, inserted into a quartz tube, heated at a ramp rate of 5° C. per minute up to an annealing temperature at 820° C. for 3.5 h, and cooled thereafter to room temperature. Samples were subsequently washed several times with distilled water, nitric acid, and distilled water. The as-prepared material was collected by centrifugation and dried at 120° C. in a drying oven.

Methods Used to Characterize $Bi_2Fe_4O_9$ Nanocubes

X-ray diffraction. Crystallographic information on $Bi_2Fe_4O_9$ samples was obtained on a Scintag diffractometer, operating in the Bragg configuration, using Cu Kα radiation (λ=1.54 Å). Samples for analyses were obtained by grinding thoroughly in ethanol using a mortar and pestle, followed by loading onto glass slides and subsequent drying in air. Diffraction patterns were collected from 10 to 70° at a scanning rate of 2° per minute with a step size of 0.02°. Parameters used for slit widths and accelerating voltages were identical for all samples.

Electron Microscopy. The particle size and morphology of the resulting $Bi_2Fe_4O_9$ products were initially characterized using a field emission SEM (FE-SEM Leo 1550) at accelerating voltages of 15 kV, which was equipped with EDS capabilities. Specifically, $Bi_2Fe_4O_9$ samples were deposited onto Si wafers as well as mounted onto conductive copper tapes, which were then attached to the surfaces of SEM brass stubs. These samples were then conductively coated with gold by sputtering them for 20 seconds to minimize charging effects under SEM imaging conditions.

Specimens for low magnification TEM and HRTEM were obtained by drying droplets of $Bi_2Fe_4O_9$ sample from an ethanolic dispersion onto a 300 mesh Cu grid, coated with a lacey carbon film. TEM images were taken at an accelerating voltage of 120 kV on a Philip CM12 instrument. HRTEM images and SAED patterns were obtained on a JEOL 2010F HRTEM at an accelerating voltage of 200 kV. This instrument was equipped with an Oxford INCA EDS system with the potential of performing SAED to further characterize individual $Bi_2Fe_4O_9$ structures.

Mössbauer. Mössbauer spectra were collected using a conventional, constant acceleration transmission Mössbauer spectrometer. The source was a 30-mCi-$^{57}$Co radioactive source in Rh matrix, maintained at room temperature. The spectrometer was calibrated using a 7-μm iron foil enriched in $^{57}$Fe. Isomer shifts are reported relative to metallic iron at room temperature. Low temperatures were achieved with a Superveritemp cryostat (Janis Research Co.). The experimental data were least square fitted to theoretical spectra using the WMoss software package (Web Research Co.) and assuming Lorentzian absorption lines.

SQUID. Magnetization measurements were obtained using an MPMS magnetometer. Powder samples of $Bi_2Fe_4O_9$ were pressed lightly, then loaded into a gel cap, and covered with silica wool. This was held within a uniform drinking straw, which was attached to the sample rod of the MPMS apparatus. Signals generated by measurements of an empty sample holder demonstrated that the holder assembly contributes <1% to the overall magnetic signal.

Characterization of $Bi_2Fe_4O_9$ Nanocubes

Figure 3:
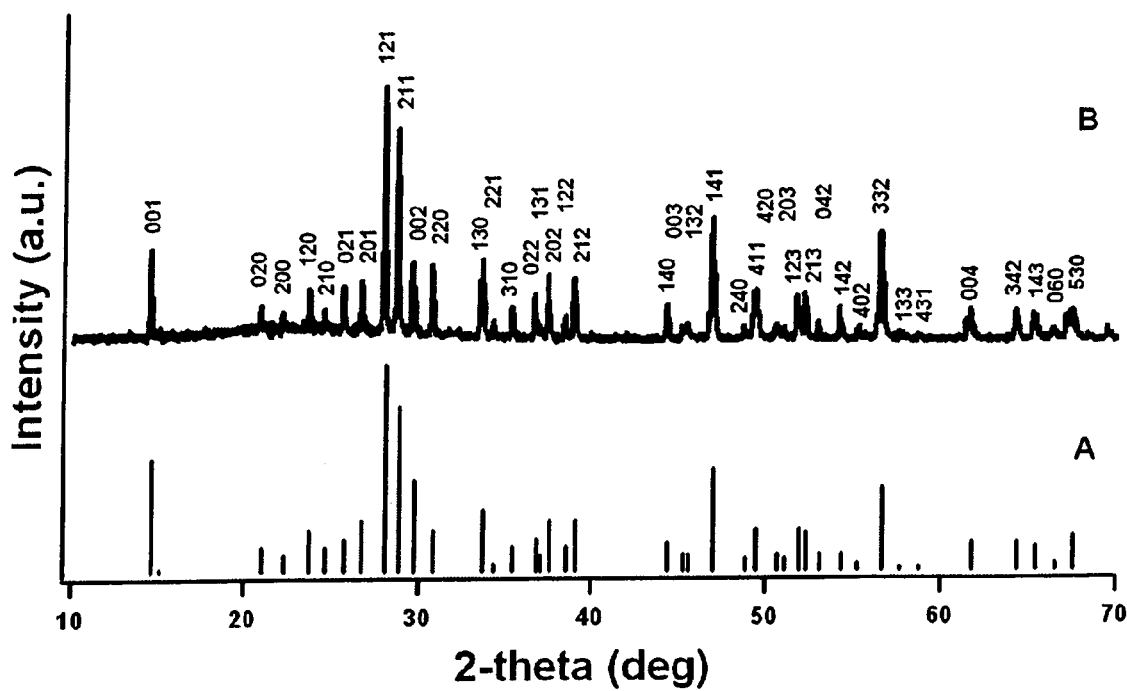
FIG. 3. XRD patterns of $Bi_2Fe_4O_9$ materials from the JCPDS #25-0090 database standard (A), and from as-prepared cubes (B). The Joint Committee on Powder Diffraction Standards (JCPDS), now International Centre for Diffraction Data (ICDD), maintains a database of powder diffraction patterns, the Powder Diffraction File (PDF).

The purity and crystallinity of as-prepared $Bi_2Fe_4O_9$ cube samples were examined by powder XRD measurements (FIG. 3). It is evident that the observed pattern of the collected powder displayed all of the expected peaks emanating from the $Bi_2Fe_4O_9$ structure, with very few if any impurity peaks. In effect, diffraction peaks in FIG. 3b can be indexed to the orthorhombic structure of $Bi_2Fe_4O_9$ [space group: Pbam] with lattice constants of a=7.965 Å, b=8.440 Å, and c=5.994 Å, which are in good agreement with literature results (i.e., JCPDS #25-0090, FIG. 1A). In addition, the relative intensities of the reflection of the (220) signal to that of the other peaks have been found to be stronger than those of the corresponding bulk materials, an observation which can be ascribed to the preferential formation of the (220) orientation during the synthesis process.

Figure 4:
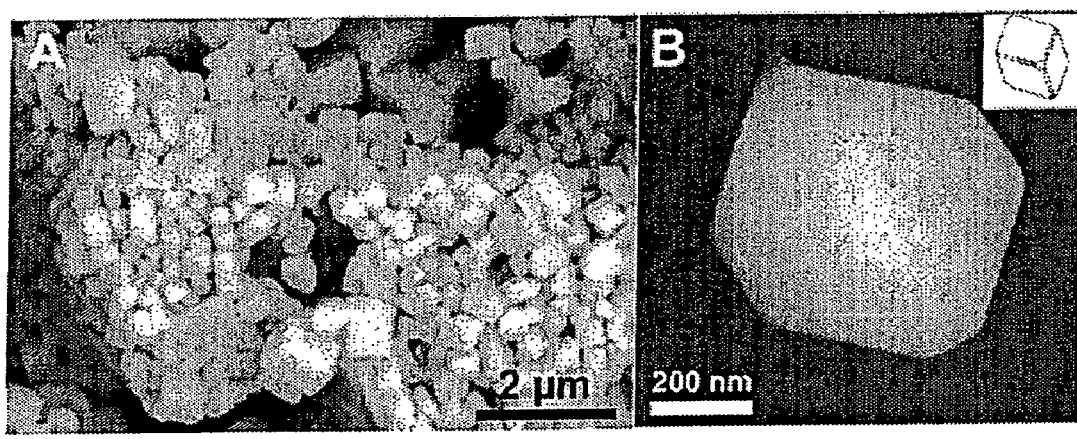
FIG. 4. SEM images of $Bi_2Fe_4O_9$ cubes prepared using a molten salt method (A). A typical individual cube is shown in (B). The inset illustrates a schematic of the facets of an individual cube.

FIG. 4 shows SEM images revealing the morphologies of as-prepared $Bi_2Fe_4O_9$. It can be observed that the $Bi_2Fe_4O_9$ product mainly consists of cubic structures. The mean edge length of the $Bi_2Fe_4O_9$ structures obtained were 386 nm with a standard deviation of 147 nm, though particles were formed with a range of ~166 to 833 nm. It is observed that the faces of the $Bi_2Fe_4O_9$ structures are essentially flat though some of the corners and edges of these structures are slightly truncated. FIG. 4B shows a representative individual $Bi_2Fe_4O_9$ structure with truncated edges which could be schematically described by the illustration shown in the inset.

Figure 5:
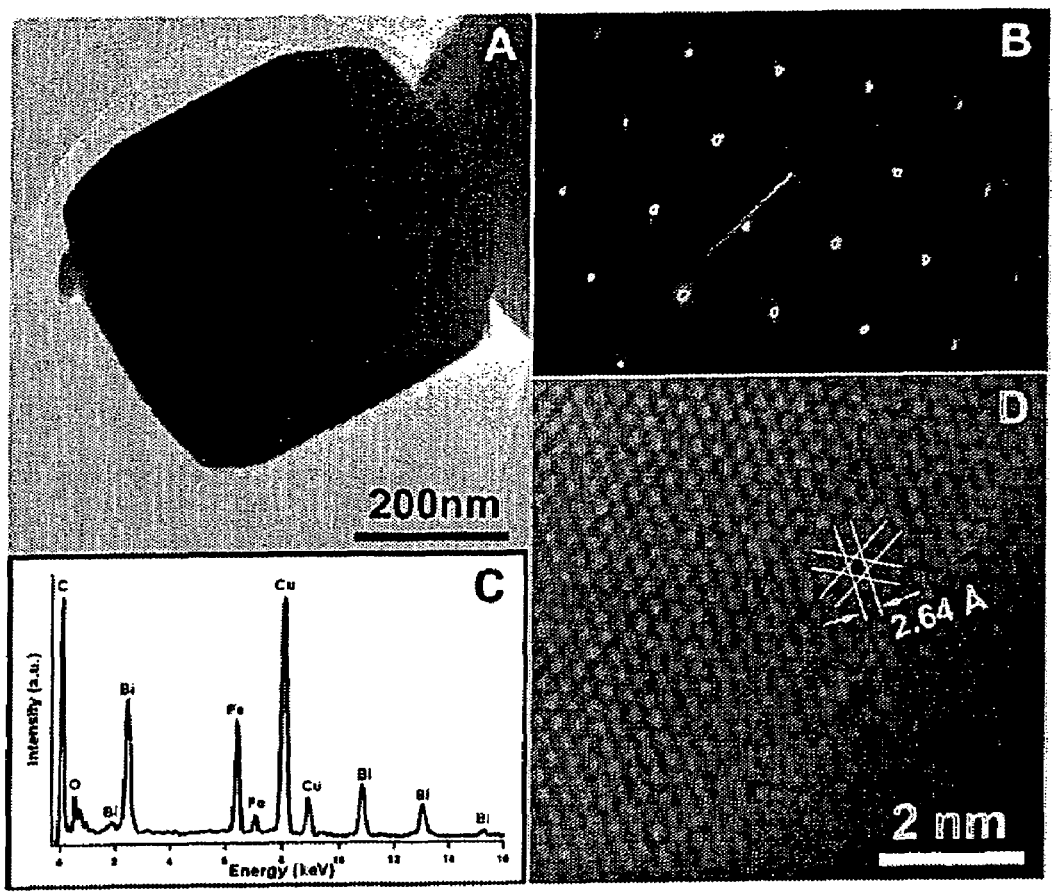
FIG. 5. (A) TEM image of an individual $Bi_2Fe_4O_9$ cube. (B) SAED pattern of a $Bi_2Fe_4O_9$ cube. (C) EDS of an as-prepared $Bi_2Fe_4O_9$ cube. The Cu and C peaks originate from the TEM grid. (D). HRTEM image of a typical portion of a $Bi_2Fe_4O_9$ cube.

A typical TEM image of $Bi_2Fe_4O_9$ submicron cubes, generated from the current molten salt method described above, is shown in FIG. 5A. SAED data taken from individual cubes (FIG. 5B) show the presence of sharp diffraction spots indicating the formation of well-developed, single-crystalline $Bi_2Fe_4O_9$. The electron diffraction patterns obtained from different areas of the cube also show similar sharp diffraction spots. In order to confirm the chemical composition of the as-prepared structures, EDS spectra (FIG. 5C) were taken at a number of selected positions of the sample. The elemental signatures obtained are identical within experimental accuracy, and essentially Bi, Fe, and O were observed. The Cu and C signals arise from the TEM grid. In FIG. 5D, a HRTEM image obtained from part of an individual $Bi_2Fe_4O_9$ cube is displayed in order to further confirm the single-crystalline nature of our as-prepared structures. This image shows a typical crystalline domain with an interplanar spacing of about 2.64 Å, compatible with the literature value of 2.654 Å, which corresponds to the {130} plane of an orthorhombic phase $Bi_2Fe_4O_9$ crystal (JCPDS #25-0090).

Figure 6:
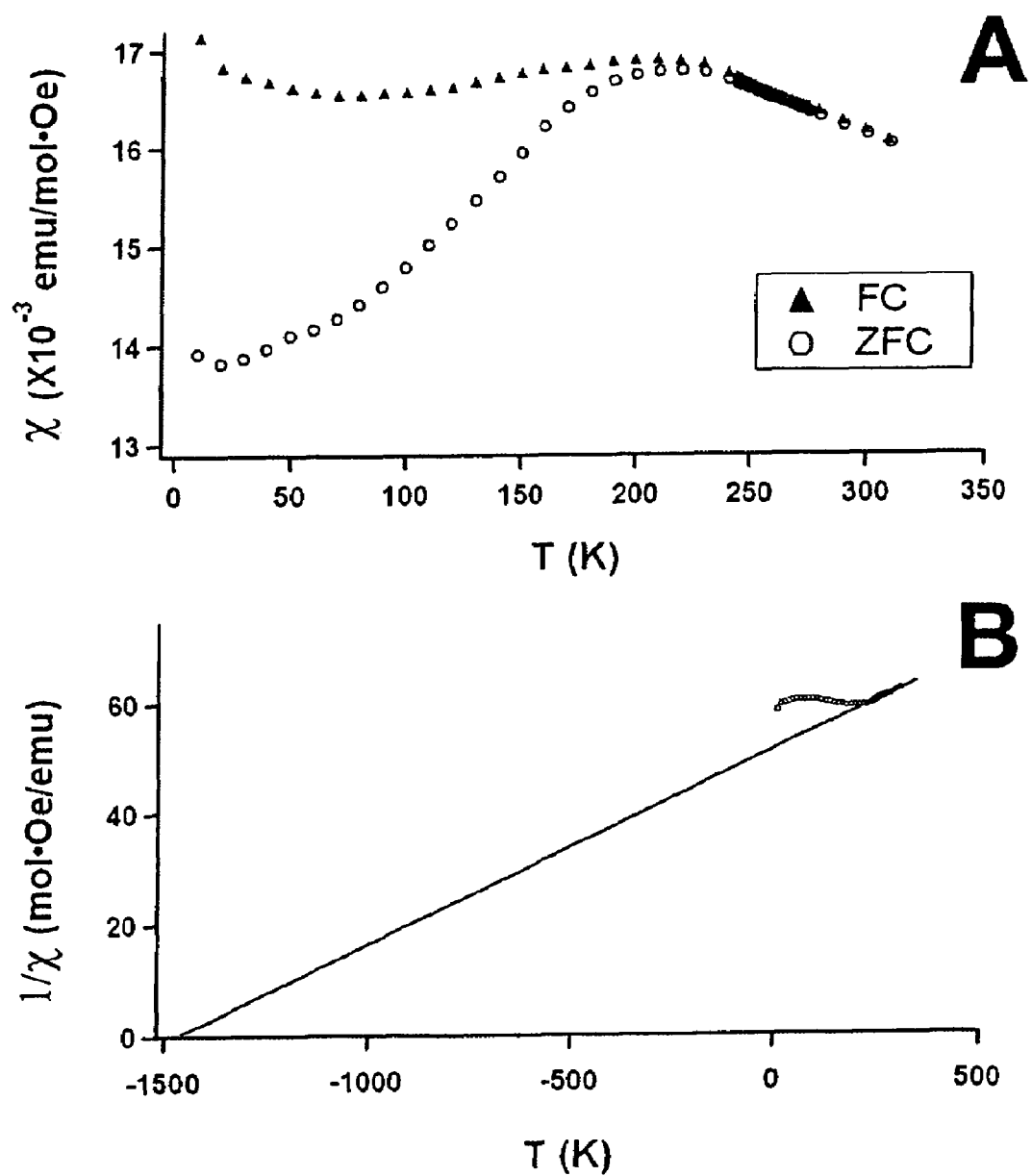
FIG. 6. (A) The temperature dependence of the magnetic susceptibility for $Bi_2Fe_4O_9$ structures, showing zero field cooling (ZFC, open circles) and field cooling (FC, closed triangles) curves with an applied magnetic field set at 1000 Oe. (B) The inverse magnetic susceptibility (represented as open circles) and fit of the Curie-Weiss law above $T_N$ (represented as a solid line) to the experimental data for $Bi_2Fe_4O_9$ structures.

FIG. 6A shows the magnetic susceptibility of the cubes as a function of temperature at an applied magnetic field strength of 1000 Oe after zero field cooling (ZFC) and also, with field cooling (FC). The curves show hysteresis below ~250 K, from the point at which the ZFC and FC plots are no longer parallel. The signals of ZFC and FC are slightly offset from each other, possibly due to a minor, remnant magnetic component with a higher $T_C$, such as $Fe_2O_3$. However, the curves do present specific antiferromagnetic behavior, as detected by other groups for this system (Agnoli, F.; Zhou, W. L.; O'Connor, C. J., Adv. Mater., 2001, 13, 1697. and Giaquinta, D. M.; Papaefthymiou, G. C.; Zur Loye, H.-C., J. Solid State Chem., 1995, 114, 199, both incorporated herein by reference in their entireties). The observations are moreover consistent with negative values of the paramagnetic Curie temperature, θ. The Curie-Weiss law, $\chi=C/(T-\theta)$ above $T_N$, provides for a value of the paramagnetic temperature for our $Bi_2Fe_4O_9$ structures, herein experimentally determined to be −1433.7 K. FIG. 6B shows a detailed plot of the inverse magnetic susceptibility (1/χ) vs. temperature (K). Even though the data were not measured through a large linear region, the straight-line fit above $T_N$ gives values comparable to previously reported data (Giaquinta, D. M.; Papaefthymiou, G. C.; Davis, W. M.; Zur Loye, H.-C., J. Solid State Chem., 1992, 99, 120 and Tutov, A. G.; Myl'nikova, I. E.; Parfenova, N. N.; Bokov, V. A.; Kizhaev, S. A., Sov. Phys. Solid State, 1964, 6, 963, both incorporated herein by reference in their entireties)

Figure 7:
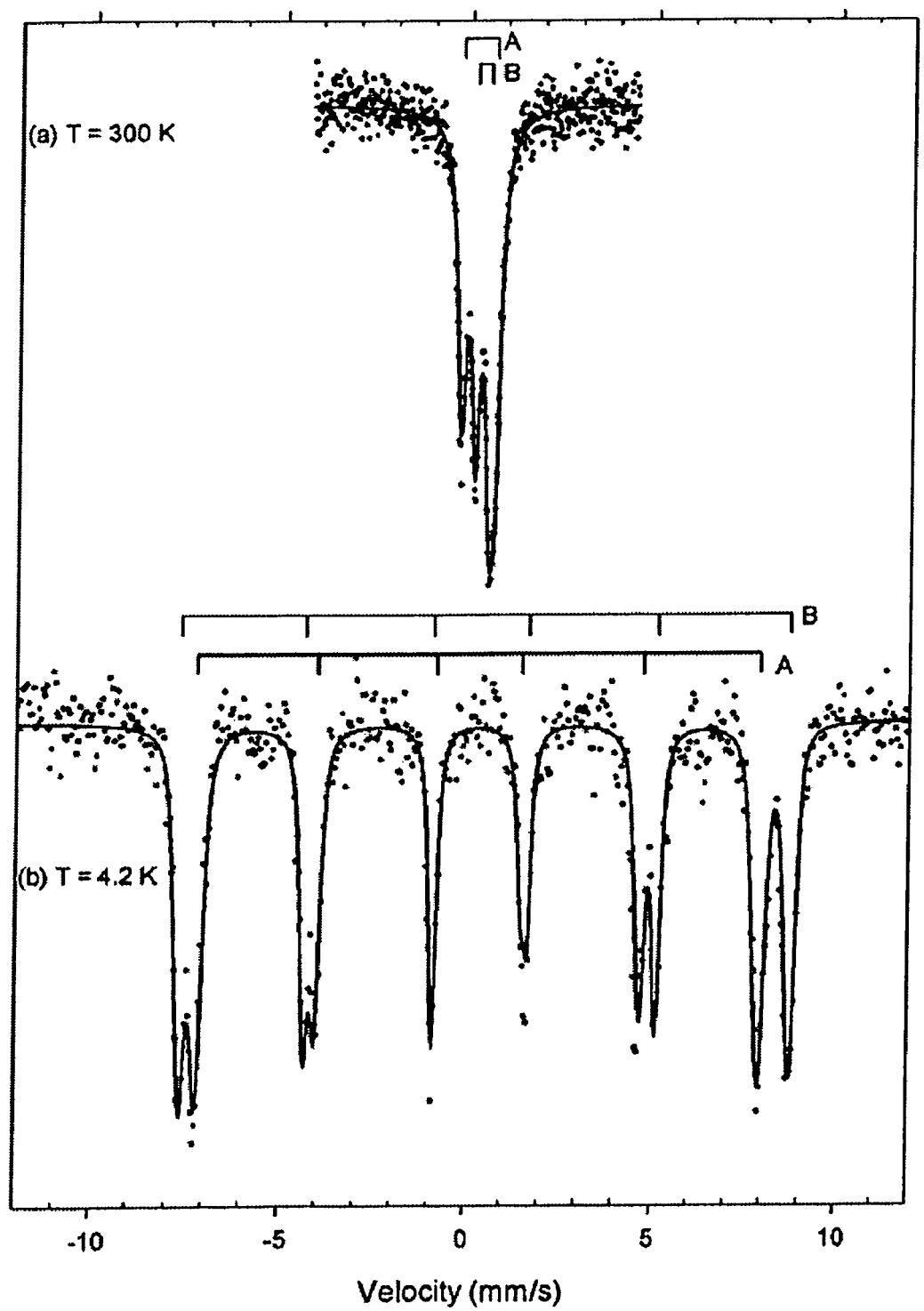
FIG. 7. Mössbauer spectra of submicron sized $Bi_2Fe_4O_9$ cubes at (a) 300 K and (b) 4.2 K. Solid lines are least square fits to experimental points, assuming a superposition of two different iron subsites, i.e. a tetrahedral (bar diagram A) one and an octahedral (bar diagram B) one.

Mössbauer spectra of the as-prepared $Bi_2Fe_4O_9$ samples were obtained at room temperature and 4.2 K, shown in FIG. 7. The room temperature spectra, FIG. 7A, were fitted to the superposition of two paramagnetic subsites, corresponding to $Fe^{3+}$ in tetrahedral and octahedral coordination. The Mössbauer parameters obtained for the tetrahedral site (bar diagram A) were: isomer shift, δ=0.24 mm/s, quadrupole splitting, $\Delta E_Q$=0.94 mm/s, and line width, Γ=0.30 mm/s, contributing 51% of the absorption area. For the octahedral site (bar diagram B), parameters obtained were: δ=0.36 mm/s, $\Delta E_Q$=0.38 mm/s, Γ=0.29 mm/s, contributing 49% of the absorption area. These Mössbauer parameters (Table 1) are consistent with previously reported data on bulk $Bi_2Fe_4O_9$ (Bokov, V. A.; Novikov, G. V.; Trukhtanov, V. A.; Yushchuk, S. I., *Sov. Phys. Solid State*, 1970, 11, 2324 and Giaquinta, D. M.; Papaefthymiou, G. C.; Zur Loye, H.-C., *J. Solid State Chem.*, 1995, 114, 199).

tion between octahedral and tetrahedral coordination, as is also indicated by the room temperature data. The above results are in agreement with previously reported data on bulk $Bi_2Fe_4O_9$ (Table 1).

Effect of Varying Experimental Parameters on Sample Shape and Size a. Role of Molar Ratio of Precursors In order to examine the role of the molar ratio of the precursor metal ions, $Bi_2Fe_4O_9$, structures were prepared using an identical molten salt method with varying molar ratios of $Bi_2O_3$ to $Fe_2O_3$. In conventional bulk ceramic

TABLE 1

Selected Mössbauer parameters for submicron-sized and bulk $Bi_2Fe_4O_9$

| T/K. | Site | $\delta^a$/mm s$^{-1}$ | $\Delta E_Q$ or ε/mm s$^{-1}$ | $H_{hf}^b$/kOe | $H_{dist}^c$/kOe | Γ/mm s$^{-1}$ | Fractional Area | Sample Size | Ref. |
|---|---|---|---|---|---|---|---|---|---|
| 300 | Tetra. | 0.24 | 0.94 | — | — | 0.30 | 0.51 | Submicron | This study |
|  | Oct. | 0.36 | 0.38 | — | — | 0.29 | 0.49 |  |  |
| 4.2 | Tetra. | 0.35 | 0.05 | 468 | 14.7 | 0.26 | 0.54 | Submicron | This study |
|  | Oct. | 0.48 | 0.17 | 507 | 14.8 | 0.20 | 0.46 |  |  |
| 300 | Tetra. | 0.24 | 0.95 | — | — | — | 0.50 | Bulk | 36 |
|  | Oct. | 0.36 | 0.37 | — | — | — | 0.50 |  |  |
| 4.2 | Tetra. | 0.34 | 0.16 | 467 | — | — | 0.50 | Bulk | 43 |
|  | Oct. | 0.48 | 0.15 | 505 | — | — | 0.50 |  |  |

$^a$Isomer shifts δ are relative to α-Fe at room temperature.
$^b$Average hyperfine magnetic field at the iron nucleus.
$^c$FWHM of the hyperfine field distribution, assumed Gaussian.

At 4.2 K, the spectra are magnetically split. This is in accordance with the ZFC/FC magnetic susceptibility studies of these submicron-sized particles, presented in FIG. 6A, which indicate that the samples undergo a magnetic phase transition below 250 K. In the bulk, $Bi_2Fe_4O_9$ has been reported to enter into an antiferromagnetically ordered state at $T_N$=263 K (Shamir, N.; Gurewitz, E., *Acta Crystallogr. A*, 1978, 34, 662.), although somewhat lower transition temperature values, ranging between 245 K and 263 K, have also been reported (Bokov, V. A.; Novikov, G. V.; Trukhtanov, V. A.; Yushchuk, S. I., *Sov. Phys. Solid State*, 1970, 11, 2324; Shamir, N.; Gurewitz, E., *Acta Crystallogr. A*, 1978, 34, 662; Groult, D.; Hervieu, M.; Nguyen, N.; Raveau, B., *J. Solid State Chem.*, 1988, 76, 248; Giaquinta, D. M.; Papaefthymiou, G. C.; Davis, W. M.; Zur Loye, H.-C., *J. Solid State Chem.*, 1992, 99, 120; Tutov, A. G.; Myl'nikova, I. E.; Parfenova, N. N.; Bokov, V. A.; Kizhaev, S. A., *Sov. Phys. Solid State*, 1964, 6, 963.)

Figure 8:
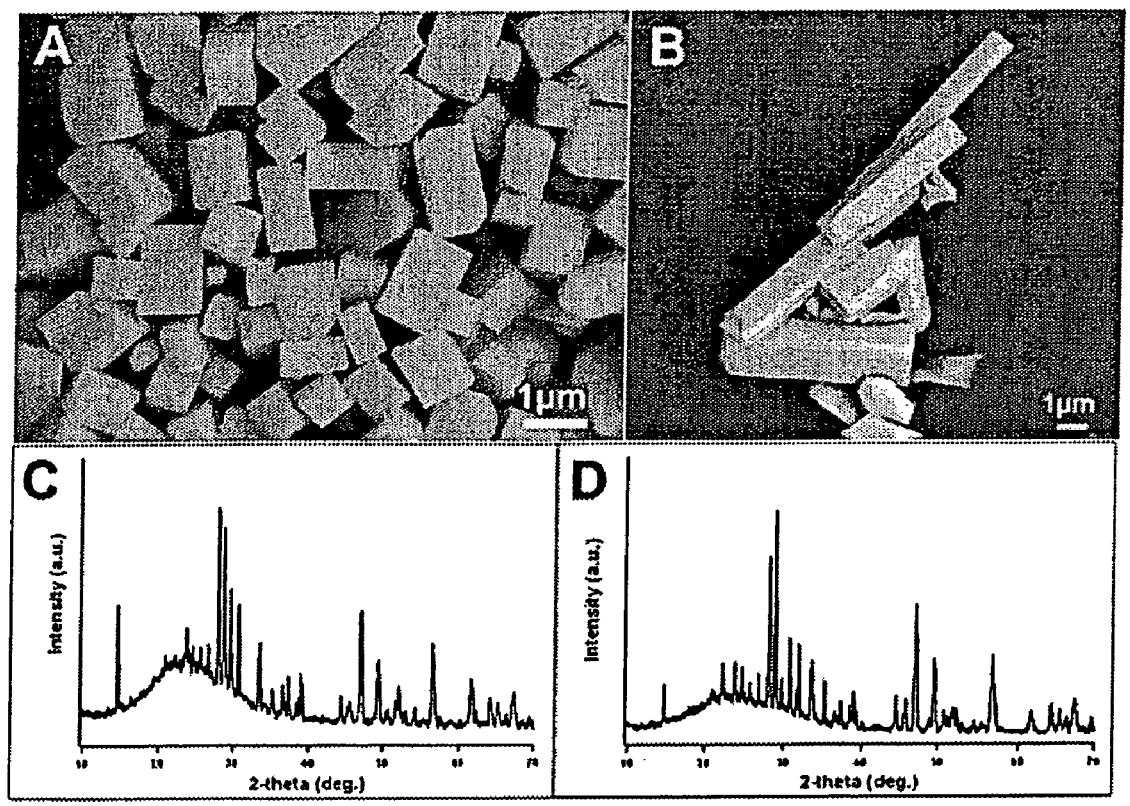
FIG. 8. SEM images of the $Bi_2Fe_4O_9$ materials prepared using a molten salt method with a 3:1 (A) and 6:1 (B) molar ratio of $Bi_2O_3$ to $Fe_2O_3$ precursors, respectively. Corresponding powder XRD patterns of as-prepared (A) and (B) $Bi_2Fe_4O_9$ materials are shown in (C) and (D), respectively.

The 4.2 K Mössbauer data were analyzed assuming the superposition of two, well-resolved, magnetic subsites corresponding to $Fe^{3+}$ occupying the tetrahedral and octahedral coordination sites, depicted in bar diagrams A and B, respectively, in FIG. 7B. Mössbauer parameters obtained from least square fits, which included magnetic field distributions about an average value, were: isomer shift δ=0.35 mm/s, average magnetic hyperfine field $H_{hf}$=468 kOe, comprising 54% of the absorption area, for the tetrahedral site; and δ=0.35 mm/s and $H_{hf}$=508 kOe, contributing 46% of the absorption area, for the octahedral site. The increase in the values of the isomer shifts at 4.2 K, as compared to those at room temperature, is consistent with the second order Doppler shift (Greenwood, N. N.; Gibb, T. C. *Mossbauer Spectroscopy*; Chapman Hall: London, 1971). Within the statistical precision of the experimental data, the relative intensity of the two subsites at 4.2 K is consistent with an approximately equal iron ion distribuapproaches, use of an excess $Bi_2O_3$ as the reactive precursor has been employed to generate corresponding amounts of similarly-shaped $Bi_2Fe_4O_9$ materials. However, in this system, the use of different molar ratios of $Bi^{3+}$ to $Fe^{3+}$ was found to generate dissimilar morphologies of $Bi_2Fe_4O_9$ products with almost identical crystallinity. SEM images and XRD measurements for samples prepared using different molar ratios are presented in FIG. 8.

For example, the morphologies of $Bi_2Fe_4O_9$ materials, prepared using a current molten salt method with 3:1 and 6:1 molar ratios of $Bi^{3+}$ to $Fe^{3+}$, respectively, are shown in FIGS. 8A and 8B. It can be observed that as-prepared $Bi_2Fe_4O_9$ structures, using a 3:1 molar ratio of $Bi_2O_3$ to $Fe_2O_3$, mainly consist of orthorhombic structures composed of smooth surfaces, showing some slightly truncated corners or edges (FIG. 8A). The mean lengths of the shorter and longer edges of the rectangular structures were measured to be 662±181 and 1043±350 nm, respectively. FIG. 8B shows typical morphologies of the $Bi_2Fe_4O_9$ structures generated from the precursors derived from a 6:1 ($Bi^{3+}$:$Fe^{3+}$) molar ratio. It is evident that the products are mostly smooth, straight, and rod-like structures. The lengths of the rods attain ~10 microns with a width of only a few microns. Also note that there is some degree of fracture and fragmentation in the product.

Comparing morphologies of the product generated from the precursors of 1:1 (FIG. 4A), 3:1 (FIG. 8A), and 6:1 (FIG. 8B) molar ratios of $Bi^{3+}/Fe^{3+}$, respectively, it is evident that the relative molar ratios of the metal ions, in the presence of surfactant, play a key role not only in the preparation of but also in the control over the final shapes of the resultant single-crystalline $Bi_2Fe_4O_9$ products. That is, whereas use of a 1:1 molar ratio of $Bi^{3+}$ to $Fe^{3+}$ generated smaller sized particles with cubic-like features, the highest molar ratio employed, i.e., 6:1 molar ratio of $Bi^{3+}$ to $Fe^{3+}$, yielded larger-sized structures with rod-like, rectangular shapes. Not surprisingly, the product generated using a 3:1 molar ratio of $Bi^{3+}$ to $Fe^{3+}$ precursors produced intermediate-sized, orthorhombically-shaped materials.

b. Role of Surfactant, Salt, and Precursor Identity

Figure 9:
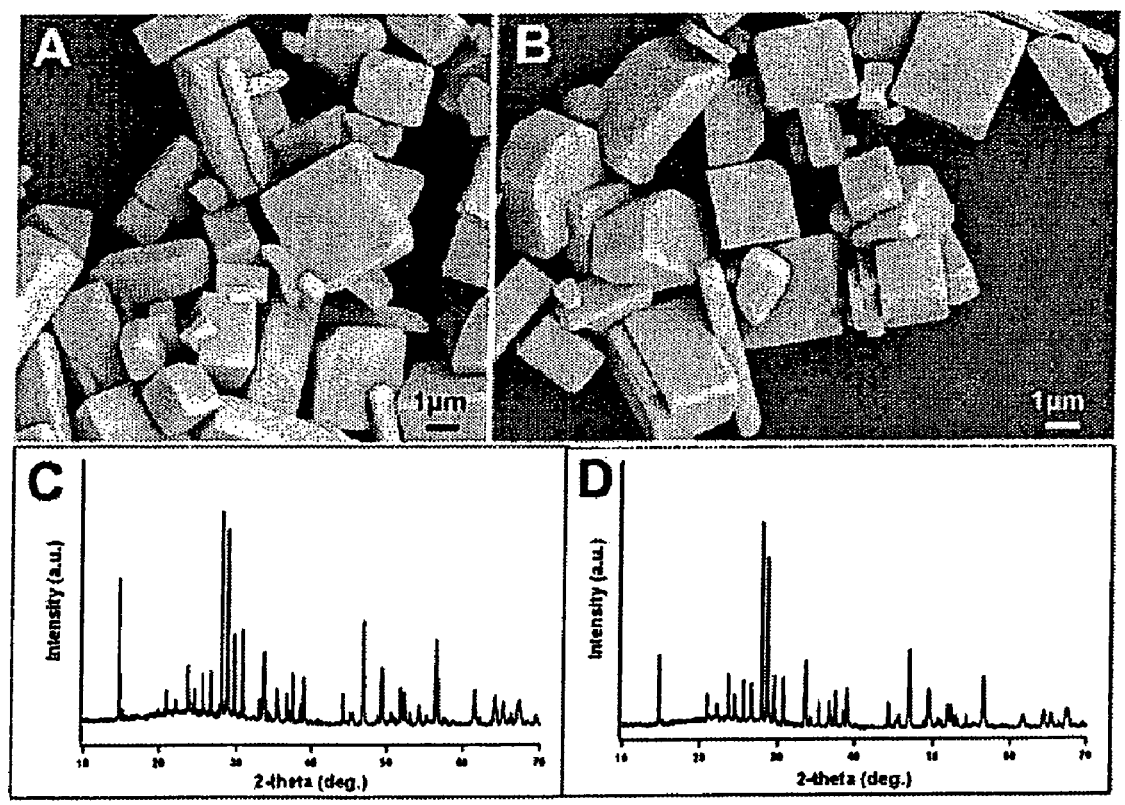
FIG. 9. SEM images of as-prepared $Bi_2Fe_4O_9$ materials prepared using an identical method, but in the absence of surfactants. Products synthesized using 1:1 (A) and 3:1 (B) molar ratios of $Bi^{3+}$ to $Fe^{3+}$ precursors, respectively. Corresponding XRD measurements are shown in (C) and (D) for as-prepared (A) and (B) $Bi_2Fe_4O_9$ materials, respectively.

To analyze the role of (i) surfactant in the reaction, $Bi_2Fe_4O_9$ products were prepared employing the identical, as-reported molten salt method in the absence of any surfactant. Morphologies of the resultant products generated from mixtures of 1:1 and 3:1 molar ratios of $Bi^{3+}$ to $Fe^{3+}$ precursors, respectively, are shown in FIGS. 9A and 9B. Although the images clearly show the presence of crystalline particles (FIGS. 9C and 9D) with smooth faces and clear, well-defined edges, it is evident that these particles are not only significantly larger, stretching from several to tens of microns but also the size distribution observed is far more polydisperse. In addition, the effect of precursor ratio on product morphologies is not as evident, since FIGS. 9A and 9B are practically indistinguishable from each other. Hence, to underlie the importance of the presence of surfactant in this reaction, it is apparent that the $Bi_2Fe_4O_9$ system loses its selectivity in terms of product shape in the absence of surfactant, regardless of the molar ratio of metal ions used.

Figure 10:
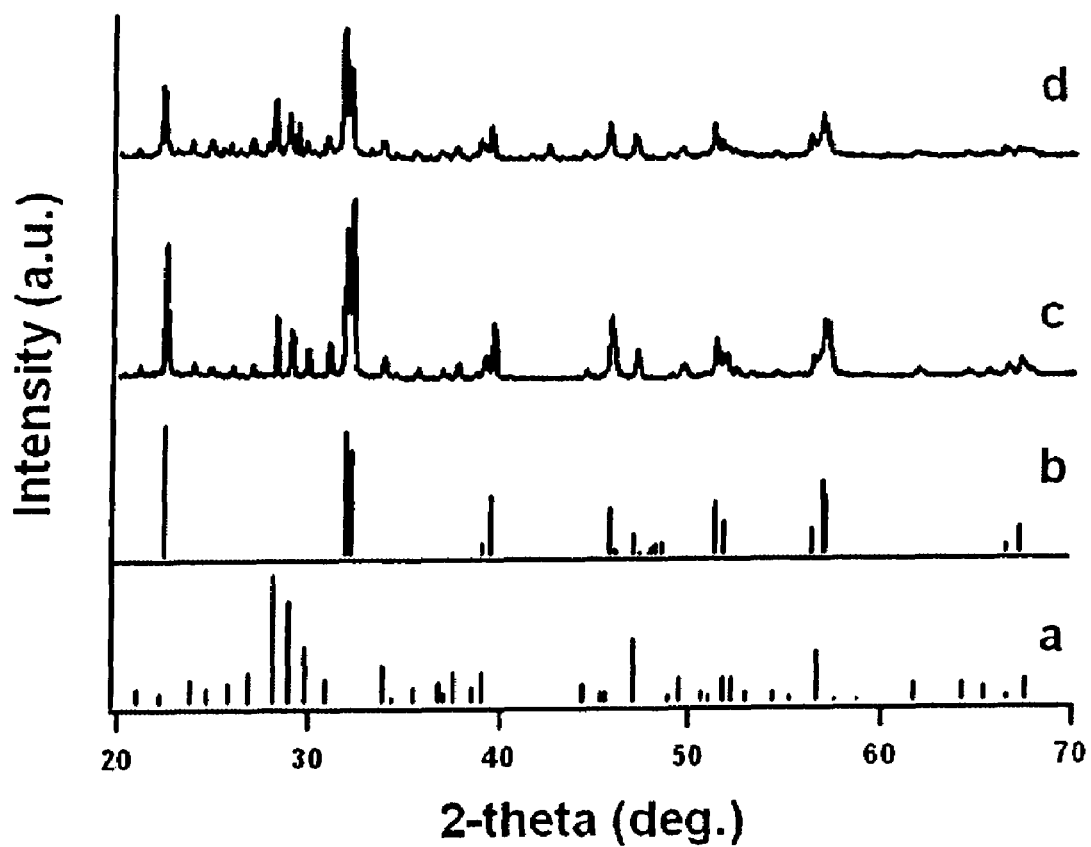
FIG. 10. Powder XRD patterns of $Bi_2Fe_4O_9$ and $BiFeO_3$ materials from the JCPDS #25-0090 (a) and #20-0169 (b) database standards, respectively. XRD of samples generated, in the presence of surfactant, from a stoichiometric 1:1 molar ratio of $Bi(CH_3CO_2)_3$ to 0.5 $Fe_2O_3$ precursors, and a 1:1 molar ratio of $Bi_2O_3$ to $Fe_2O_3$ in the absence of any salt, i.e. NaCl, are shown in (c) and (d), respectively.
Figure 16:
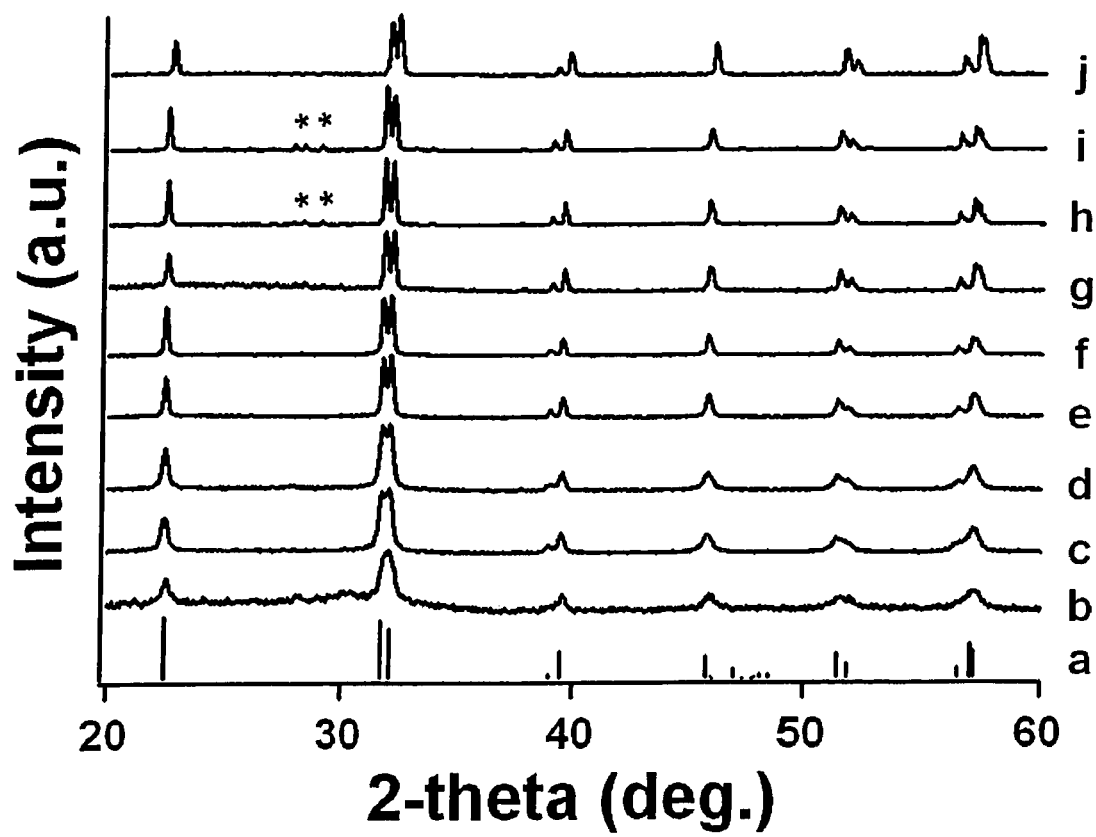
FIG. 16. XRD patterns of $BiFeO_3$ materials from the JCPDS #20-0169 database standard (a), and of as-prepared $BiFeO_3$ nanoparticles annealed at 400 (b), 450 (c), 500 (d), 550 (e), 600 (f), 650 (g), 700 (h), and 800° C. (i), respectively. As a comparison, XRD patterns from the bulk prepared herein are shown in (j). In (h) and (i), a trace of second phase peaks which are mostly from $Bi_2Fe_4O_9$ structures, has been indicated as asterisks.

The importance of (ii) salt as well as (iii) the identity of selected precursors in this system was also studied. In separate experiments, samples were prepared employing an identical method either in the absence of any salt or in the presence of different types of precursors, e.g., $Bi(CH_3CO_2)_3$ as opposed to $Bi_2O_3$. FIG. 10 shows XRD patterns obtained from each of the samples generated, all in the presence of surfactant, from a stoichiometric 1:1 molar ratio of $Bi(CH_3CO_2)_3$ to 0.5 $Fe_2O_3$ precursors (FIG. 10C), and a 1:1 molar ratio of $Bi_2O_3$ to $Fe_2O_3$ in the absence of any salt, i.e., NaCl (FIG. 10D), respectively. In addition, JCPDS database results for $Bi_2Fe_4O_9$ (#25-0090) and $BiFeO_3$ (#20-0169) are shown, respectively, in FIGS. 10A and 10B. It is evident that the sample obtained from a stoichiometric 1:1 molar ratio of $Bi(CH_3CO_2)_3$ to 0.5 $Fe_2O_3$ precursors (FIG. 10C) was essentially a mixture of pure $BiFeO_3$ (70%) and $Bi_2Fe_4O_9$ (30%) materials. In addition, the sample prepared conventionally without the presence of salt (FIG. 10D) yielded an XRD pattern, similar to that seen in FIG. 10C, that contained significantly more impurity phases as well as dissimilar intensities of the existing peaks. An example of the polydisperse nature of the resulting product morphology of that sample is shown in FIG. 16.

The presence of salt is expected to decrease the melt viscosity and thereby increase the mobility of components within the molten flux, whereas the presence of surfactant may prevent interparticle aggregation by forming a 'shell' around individual particles. (Li, et al.; Wang, W., *Solid State Commun.*, 2003, 127:639.)

Example 3

Doping of the Molten Salt Synthesis for $BiFeO_3$-$BaTiO_3$ Solid Solution

Bismuth(III) acetate (Aldrich, 99.99%), iron(III) oxide (Aldrich, nanopowder), barium oxalate (Aldrich, 97%), titanium dioxide (Alfa Aesar, 99.7%), and Igepal® CO-630 or NP-9 surfactant (polyoxyethylene(9)nonylphenyl ether, Aldrich), NaCl (Mallinckrodt) were used as supplied. Stoichiometric amounts of $Bi(CH_3CO_2)_3$ and/or $BaC_2O_4$ (combined in relevant molar ratios, depending on the desired product), $Fe_2O_3$, $TiO_2$, NaCl and NP-9 were mixed in molar ratios of 2:1:2:40:3, thoroughly ground in an agate mortar, and sonicated. The mixture was then placed in a quartz crucible, inserted into a quartz tube, heated at a ramp rate of 5° C. per minute up to an annealing temperature at 820° C. for 3.5 h in a Lindberg tube furnace, and subsequently cooled to room temperature. Samples were subsequently washed several times with distilled water, nitric acid, and distilled water. The as-prepared material was collected by centrifugation and dried at 120° C. in a drying oven.

Example 4

Synthesis of $BiFeO_3$ Nanoparticles by Sol-Gel Synthesis

Bismuth(III) nitrate pentahydrate (Aldrich, 98+%), bismuth(III) oxide (Aldrich, 99.99%), iron(III) nitrate nonahydrate (Aldrich, 98+%), and iron(III) oxide (Aldrich, nanopowder) were used as supplied. In a typical synthesis of $BiFeO_3$ nanoparticles, 5 mmoles of $Bi(NO_3)_3 \cdot 5H_2O$ and $Fe(NO_3)_3 \cdot 9H_2O$ were added successively to 12 ml of ethylene glycol. The mixture was stirred at 80° C., after which a transparent sol was recovered upon evaporation of the excess ethylene glycol. Then, the resultant gel samples were preheated to 400° C. for three separate runs at a ramp-rate of 5° C./min in order to remove excess hydrocarbons and $NO_x$ impurities. To obtain reasonable size variation, the samples were further annealed at 400, 450, 500, 550, 600, 650, 700 and 800° C. for 30 min, respectively. The samples obtained were ground in a mortar, washed with distilled water with an application of sonication, and collected by centrifugation.

Methods Used to Characterize $BiFeO_3$ Nanoparticles

XRD.: The purity and crystallinity of as-prepared $BiFeO_3$ nanoparticles were examined by powder XRD measurements (FIG. 16). XRD peaks from $BiFeO_3$ samples annealed at 400, 450, 500, 550, 600, 650, 700 and 800° C. are shown in FIG. 16(b), (c), (d), (e), (f), (g), (h) and (i), respectively. By means of comparison, XRD peaks from a bulk sample are shown in FIG. 16(j). It is evident that the observed patterns of the collected powders displayed all of the expected peaks emanating from the $BiFeO_3$ structure, with very few impurity peaks. In effect, diffraction peaks in FIG. 16 can be indexed to the rhombohedral structure of $BiFeO_3$ [space group: $R_{3c}$] with lattice constants of $a=b=c=5.63$ Å and $\alpha=\beta=\gamma=59.4°$, which are in good agreement with literature results (i.e., JCPDS #20-0169 and FIG. 16(a)). Peaks corresponding to $BiFeO_3$ samples annealed at 700 and 800° C. (shown in FIG. 16(h) and (i), respectively) show a trace of secondary signals (indicated as asterisks) emanating mainly from $Bi_2Fe_4O_9$ structures. The intensities of these impurity peaks tend to increase with annealing temperatures over 700° C.

Peaks from samples annealed at 400° C. (FIG. 16(b)) show complete overlap in several regions. For instance, expected differentiation between distinctive rhombohedral peaks located at 31.8° and 32.1° is missing. This observation can be attributed to peak broadening, likely emanating from the smaller sizes of these as-prepared $BiFeO_3$ nanoparticles. It is evident that the size-dependent peak broadening effect becomes less important for $BiFeO_3$ samples annealed at successively higher temperatures (450 to 650° C., FIG. 16(c) to (g), respectively), indicating that larger particles are formed at higher annealing temperatures.

Figure 17:
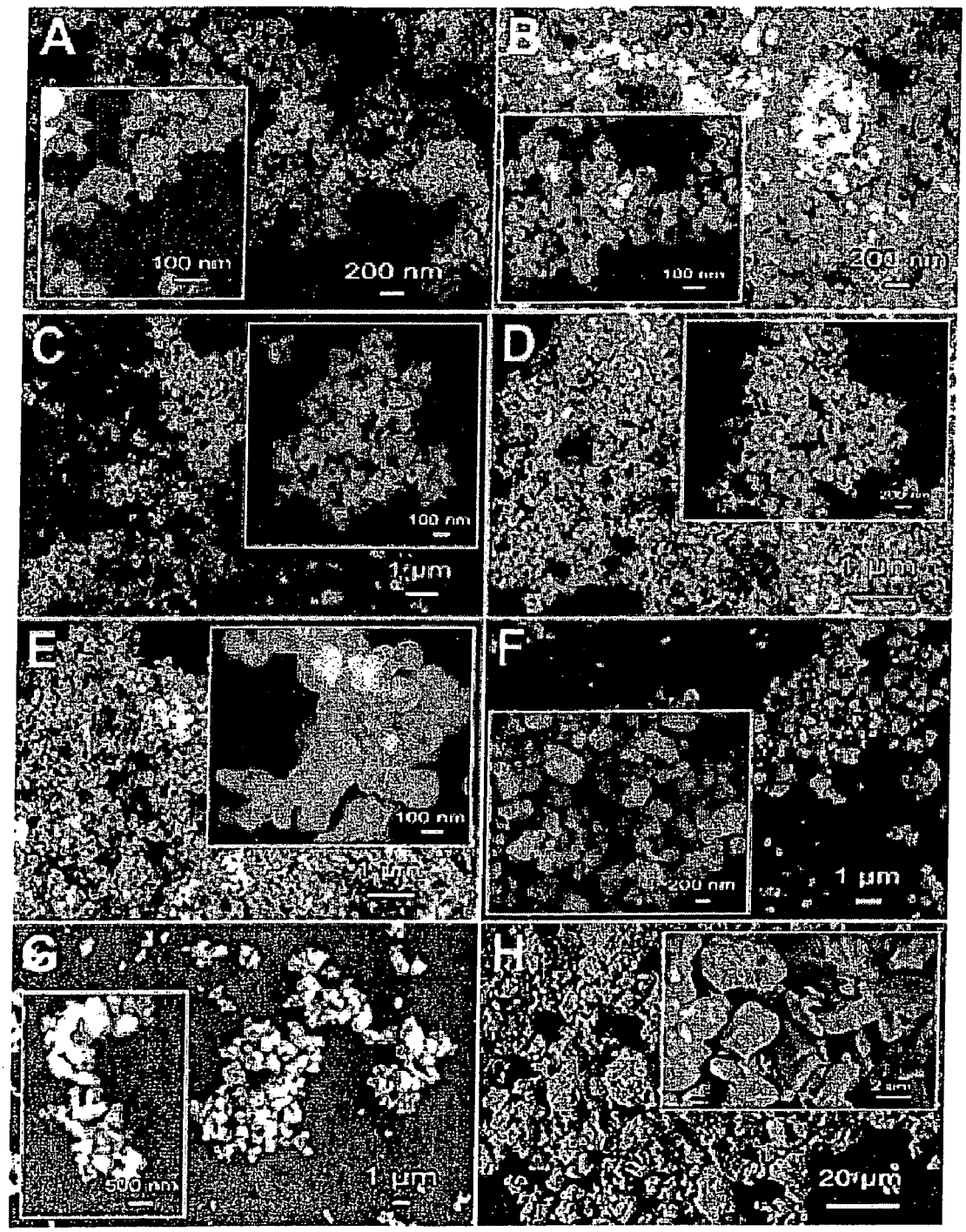
FIG. 17. SEM images of as-prepared $BiFeO_3$ nanoparticles annealed at 400 (A), 450 (B), 500 (C), 550 (D), 600 (E), 650 (F), and 700° C. (G), as well as the bulk (H). The insets show higher magnification images of as-prepared $BiFeO_3$ nanoparticles, respectively.

SEM. FIG. 17 shows SEM images revealing the morphologies of as-prepared $BiFeO_3$ products. It is evident that the size of these as-prepared $BiFeO_3$ nanoparticles is directly related to the annealing temperature used to synthesize these materials. That is, particle size decreases with lower annealing temperatures, an interpretation in good agreement with XRD results. The present data show that bismuth ferrite products annealed at temperatures less than or equal to 600° C. mainly consist of solid, crystalline nanoparticles with mean sizes below 100 nm (FIG. 17A-E). In particular, the size of $BiFeO_3$ nanoparticles annealed at 400° C. is comparable with that of particulate gold (measuring 10-20 nm), deposited on a Si substrate (FIG. 17A). This observation is compatible with calculations derived from XRD measurements. The sizes of the as-prepared $BiFeO_3$ nanostructures annealed at 450, 500, 550, and 600° C., were measured to be 41±15 (B), 51±7 (C), 75±17 (D), and 95±28 (E) nm, respectively. While these data reflect the qualitative trend obtainable from XRD, the size measurements, obtainable from SEM, of the as-prepared $BiFeO_3$ nanoparticles deviate somewhat from XRD calculations using the Debye-Schërrer equation, suggesting that the as-synthesized nanomaterials likely possess a more complex morphology such as the presence of multi-grained, coalesced structures.

The morphologies of the $BiFeO_3$ products annealed at temperature at 650 and 700° C. are shown in FIGS. 17F and 17G, respectively. Although these images clearly show the presence of crystalline particles with smooth faces and clear edges, it is also evident that these particles are not only significantly larger with sizes measuring in the range of 245±81 and 342±100 nm, respectively, but also that their size distribution is far more polydisperse and associated SEM images show the presence of increased debris. Therefore, coupled with XRD results, it is preferred that annealing temperatures less than 700° C. should be used in order to obtain reasonably-sized $BiFeO_3$ nanostructures in the current sol-gel system. As a comparison in terms of morphology and size, the SEM image of a bulk $BiFeO_3$ sample is shown in FIG. 17H.

Table 2. A summary of room-temperature magnetic parameters obtained for $BiFeO_3$ samples. Size represents typical dimension of $BiFeO_3$ nanoparticles. $M_S$ is the magnetization observed at H=50 kOe; M is the magnetic moment defined in units of Bohr magnetons per Fe atom; and $T_B$ is the blocking temperature illustrated in FIG. 13 and discussed in the text.

Figure 20:
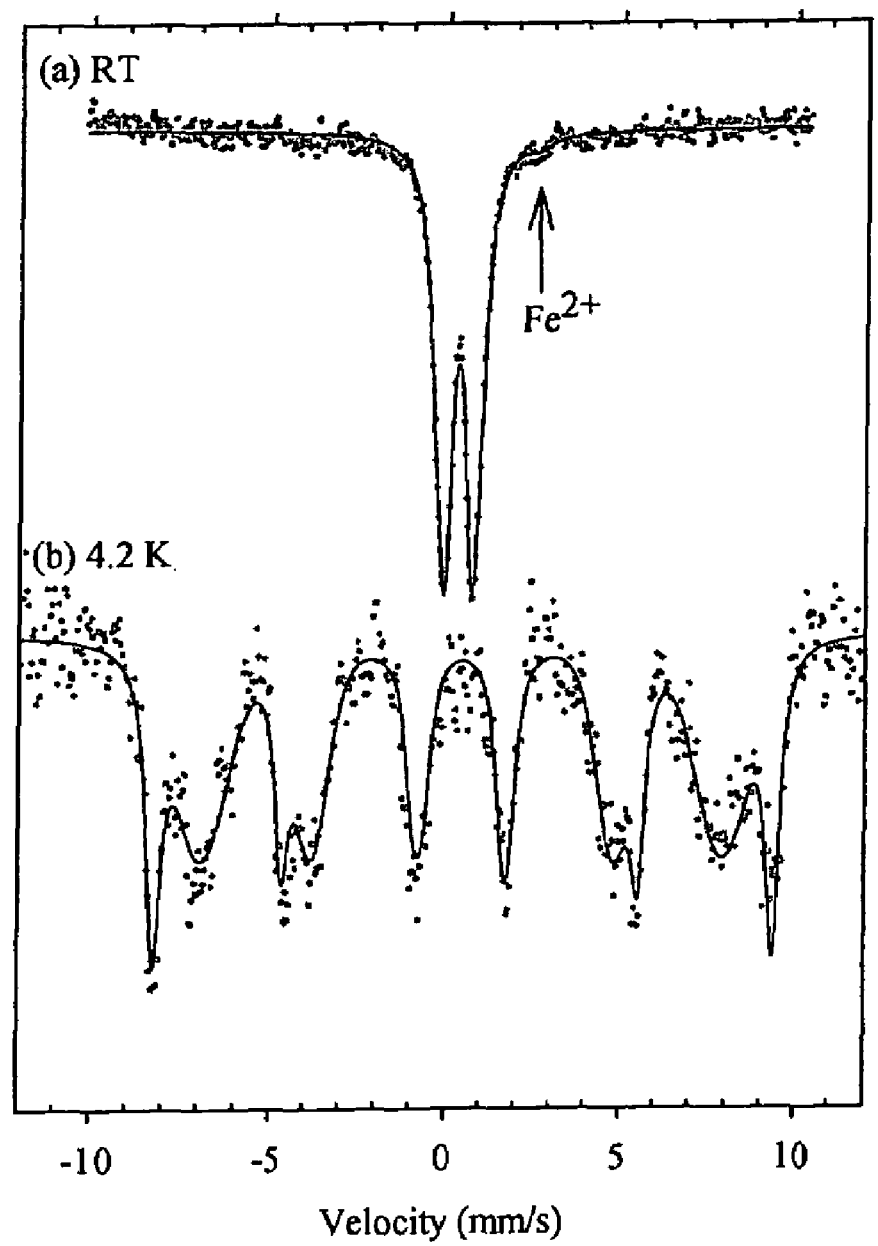
FIG. 20. Mössbauer spectra of an as-prepared, 300° C. preheated sample measured at (a) 300 K and (b) 4.2 K. Solid lines are least square fits of the experimental points to theoretical spectra, assuming a superposition of inequivalent iron sites with Lorentzian absorption lines. Derived Mössbauer parameters are given in Table 2.

Mössbauer. Only a minute signature, about a 2% effect, could be associated with $Fe^{2+}$, as indicated by the arrow in FIG. 18. In FIG. 20, the 300° C. preheated sample Mössbauer spectra collected at 300 K and at 4.2 K are compared. The appearance of magnetic structure at 4.2 K confirms that these, the smallest of particles studied (d<14 nm), are magnetically ordered, but with a blocking temperature below room temperature.

Raman discussion. A temperature-dependent Raman scattering study on single-crystals of $BiFeO_3$ revealed the presence of (i) a ferroelectric-to-paraelectric phase transition as well as (b) colossal phonon anomalies around the Neél temperature ($T_N$), indicative of a very strong spin-phonon coupling and attributable to interactions between magnetic and ferroelectric order parameters. In addition, the observed negligible longitudinal optic-tangential optic splitting of the $A_1$ normal modes indicated that short-range interatomic forces likely dominated over longer-range Coulombic, ionic forces within the pseudo-tetragonal symmetry of bismuth ferrite thin films. Raman studies were also performed on a series of bulk, polycrystalline Bi-based superconductor/insulator (BSCCO/$BiFeO_3$) composites; a number of peaks were reliably assigned to that of bismuth ferrite itself[3].

In order to comprehend the role of phonons in 0-D $BiFeO_3$ nanostructures, a Raman spectroscopy study was completed on as-prepared multiferroic $BiFeO_3$ nanoparticles. The overall spectral signature of $BiFeO_3$ nanoparticles is compatible with that of the bulk $BiFeO_3$ thin film, with the exception of a peak at 136 $cm^{-1}$. It is evident that the intensity of the peak at 136 $cm^{-1}$ decreases with respect to the corresponding size decrease in nanoparticulate $BiFeO_3$. In results cited earlier on films, the peak at 136 $cm^{-1}$ was attributed to longitudinal-

TABLE 2

Mössbauer parameters of single crystalline $BiFeO_3$ at T = 300 K. unless otherwise indicated.

| Sample | δ* (mm/s) ± 0.03 | $\Delta E_Q$ or $\epsilon$# (mm/s) ± 0.05 | $H_{hf}$ (kOe) ± 3 | Γ+ (mm/s) ± 0.02 | Area (%) ± 2 | Particle Size (nm) |
|---|---|---|---|---|---|---|
| Preheated at | 0.33 | 0.79 | — | 0.23 | 73 | Not measured |
| 300° C. | 0.31 | 1.29 | — | 0.23 | 25 | |
|  | 1.33 | 2.47 | — | 0.23 | 2 | (<14 nm) |
| Measured at | 0.49 | −0.02 | 458 | 1.17 | 66 | |
| T = 4.2 K. | 0.49 | 0.13 | 544 | 0.53 | 34 | |
| Annealed at | 0.32 | 0.71 | — | 0.40 | 34 | 14 |
| 400° C. | 0.31 | 1.09 | — | 0.51 | 32 | |
|  | 0.35 | 0.04 | 471 | 0.44 | 16 | |
|  | 0.37 | 0.09 | 488 | 0.35 | 18 | |
| Annealed at | 0.41 | 0.64 | — | 0.63 | 6 | 51 ± 7 |
| 500° C. | 0.28 | 0.82 | — | 0.63 | 12 | |
|  | 0.37 | 0.08 | 483 | 0.45 | 43 | |
|  | 0.38 | 0.32 | 488 | 0.41 | 39 | |
| Annealed at | 0.39 | 0.06 | 484 | 0.42 | 46 | 95 ± 28 |
| 600° C. | 0.38 | 0.32 | 489 | 0.35 | 54 | |
| Bulk | 0.39 | −0.10 | 493 | 0.36 | 47 | |
|  | 0.38 | 0.34 | 499 | 0.34 | 53 | |

*Isomer shifts referenced to metallic iron at room temperature.
$\epsilon = \Delta E_Q (3\cos^2\theta - 1)/2$, where θ is the angle between the direction of the principal component of the electric field gradient and the direction of the local magnetic field.
+Γ, full width at half maximum.

optical and transverse-optical $A_l$ normal modes of P4 mm symmetry. Calculations suggested that the most dominant force constant for all three normal $A_l$ modes in BiFeO$_3$ system can be ascribed to Bi—O1, suggesting the relatively more important contribution of Bi—O bonds to the observation of optical phonon modes as compared with that of Fe—O bonds.

XRD. Crystallographic information on BiFeO$_3$ nanoparticles were obtained on a Scintag diffractometer, operating in the Bragg configuration using Cu Kα radiation (λ=1.54 Å). The powder X-ray diffraction (XRD) samples were generated by thorough grinding in ethanol using a mortar and pestle, followed by loading onto glass slides and subsequent drying in air. Diffraction patterns were collected from 10 to 80° at a scanning rate of 2° per minute with a step size of 0.02°. Parameters used for slit widths and accelerating voltage were identical for all samples.

SEM. The particle size and morphology of the resulting BiFeO$_3$ products were initially characterized using a field emission scanning electron microscope (SEM, Leo 1550) at accelerating voltages of 15 kV. This instrument was equipped with energy dispersive X-ray spectroscopy (EDX) capabilities. Specifically, BiFeO$_3$ samples were deposited onto Si wafer, which were then attached onto the surface of SEM brass stubs using a Cu tape. With prior sonication, a more dispersed distribution of particles is possible to isolate. Samples were then conductively coated with gold by sputtering them for 10 seconds twice to minimize charging effects under standard SEM imaging conditions.

TEM. Specimens for transmission electron microscopy (TEM) and high resolution TEM (HRTEM) were obtained by drying BiFeO$_3$ sample droplets from an ethanolic dispersion onto a 300 mesh Cu grid coated with a lacey carbon film. TEM images were taken at an accelerating voltage of 120 kV on a Philip CM12 instrument. High resolution images were obtained on a JEOL 2010F HRTEM at an accelerating voltage of 200 kV. This instrument was equipped with an Oxford INCA EDS system with the potential of performing selected area electron diffraction (SAED) to further characterize individual BiFeO$_3$ nanostructures.

Mössbauer. Mössbauer spectra were collected using a conventional, constant acceleration transmission Mössbauer spectrometer. The source was a 30-mCi-$^{57}$Co radioactive source in Rh matrix, maintained at room temperature. The spectrometer was calibrated using a 7-μm iron foil enriched in $^{57}$Fe. Isomer shifts were reported relative to metallic iron at room temperature. Low temperatures were achieved with a Superveritemp cryostat (Janis Research Co.). The experimental data were least square fitted to theoretical spectra using the WMoss software package (Web Research Co.) and assuming Lorentzian absorption lines.

SQUID. Magnetization measurements were obtained using an MPMS magnetometer. Powder samples of BiFeO$_3$ were pressed lightly, then loaded into a gel cap, and covered with silica wool. This was held within a uniform drinking straw, which was attached to the sample rod of the MPMS apparatus. Signals generated by measurements of an empty sample holder demonstrated that the holder assembly contributed <1% to the overall magnetic signal.

Raman. Specimens were prepared by depositing a droplet of BiFeO$_3$ samples from an ethanolic dispersion onto a Si wafer. The spectra were acquired with a Raman micro spectrometer (Renishaw 1000, Drexel University Central Characterization Facility) using an Ar ion laser (514.5 nm) in back-scattering geometry. A 50× objective and low laser power density were chosen for irradiation of the sample and signal collection. The laser power was kept low enough to avoid heating of the samples by optical filtering and/or defocusing the laser beam at the samples surface. Spectra were collected in the range 1000 to 100 cm$^{-1}$ with a resolution of 1 cm$^{-1}$.

Results and Discussion: Bismuth Ferrite Nanoparticles

A facile sol-gel methodology based on the glycol-gel reaction in the synthesis of single-crystalline BiFeO$_3$ nanoparticles has been provided. Their sizes have been thermodynamically controlled in order to obtain reproducible size variations ranging from less than 15 nm to greater than 100 nm. As-prepared nanoparticles of BiFeO$_3$, especially those with a diameter range on the order of as well as smaller than the 62 nm wavelength of their intrinsic spiral-modulated spin structure, show strong property correlations with their sizes, an assertion which has been confirmed from superconducting quantum interference device (SQUID) and Mössbauer measurements.

The observed diffraction peaks in patterns of collected powders can be indexed to the rhombohedral structure of BiFeO$_3$ [space group: R$_{3c}$] with lattice constants of a=b=c=5.63 Å and α=β=γ=59.4°, which are in good agreement with literature results (i.e., JCPDS #20-0169, Figure S1). The sizes of the as-prepared BiFeO$_3$ nanostructures (e.g. crystalline particles with smooth faces and clear edges) annealed at 450, 500, 550, 600, 650, and 700° C. were measured to be 41±15 nm, 51±7 nm, 75±17 nm, 95±28 nm, 245±81, and 342±100 nm, respectively, from scanning electron microscopy (SEM) images (FIG. 17).

Figure 11:
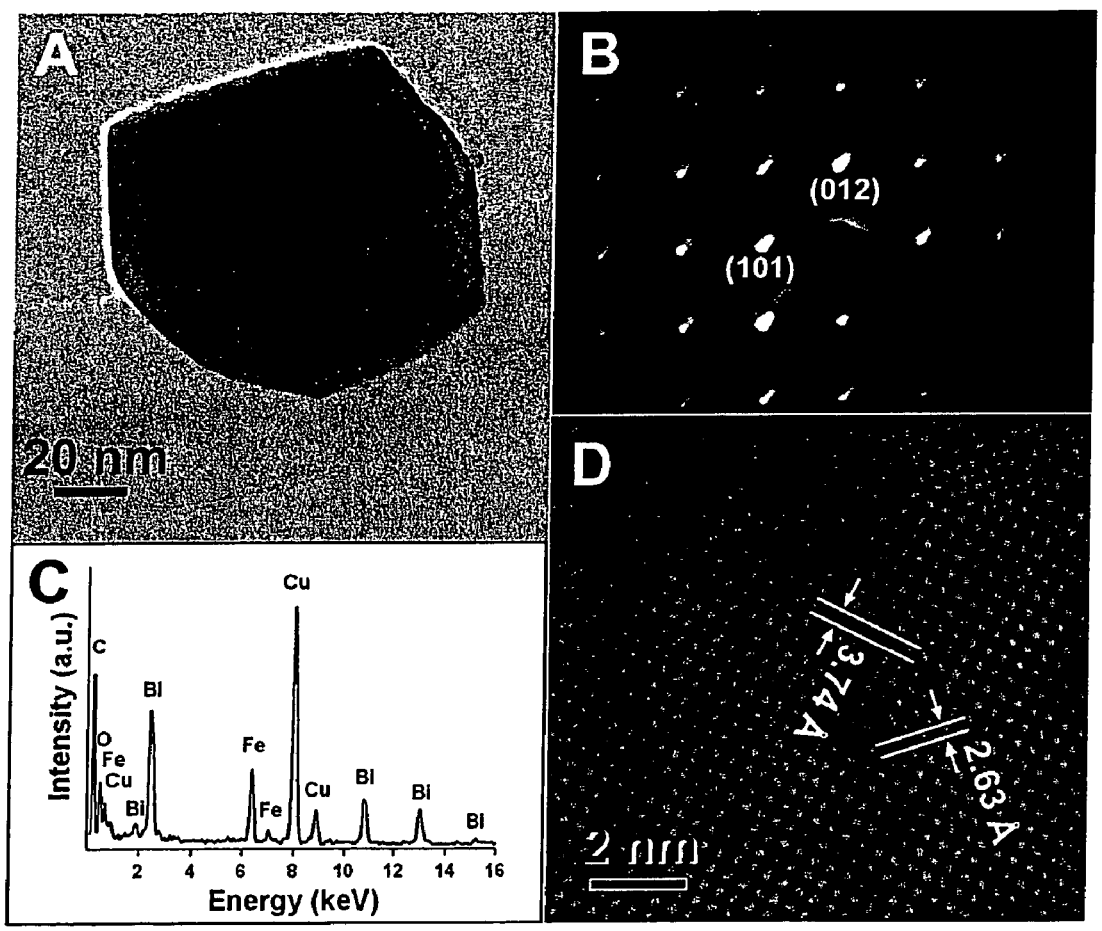
FIG. 11. TEM image (A) as well as SAED pattern (B) of an individual $BiFeO_3$ nanoparticle (95 nm) generated from the annealing temperature at 600° C., and its corresponding EDS (C). The Cu and C peaks originate from the TEM grid. (D) HRTEM image of a typical portion of a corresponding $BiFeO_3$ nanoparticle.
Figure 18:
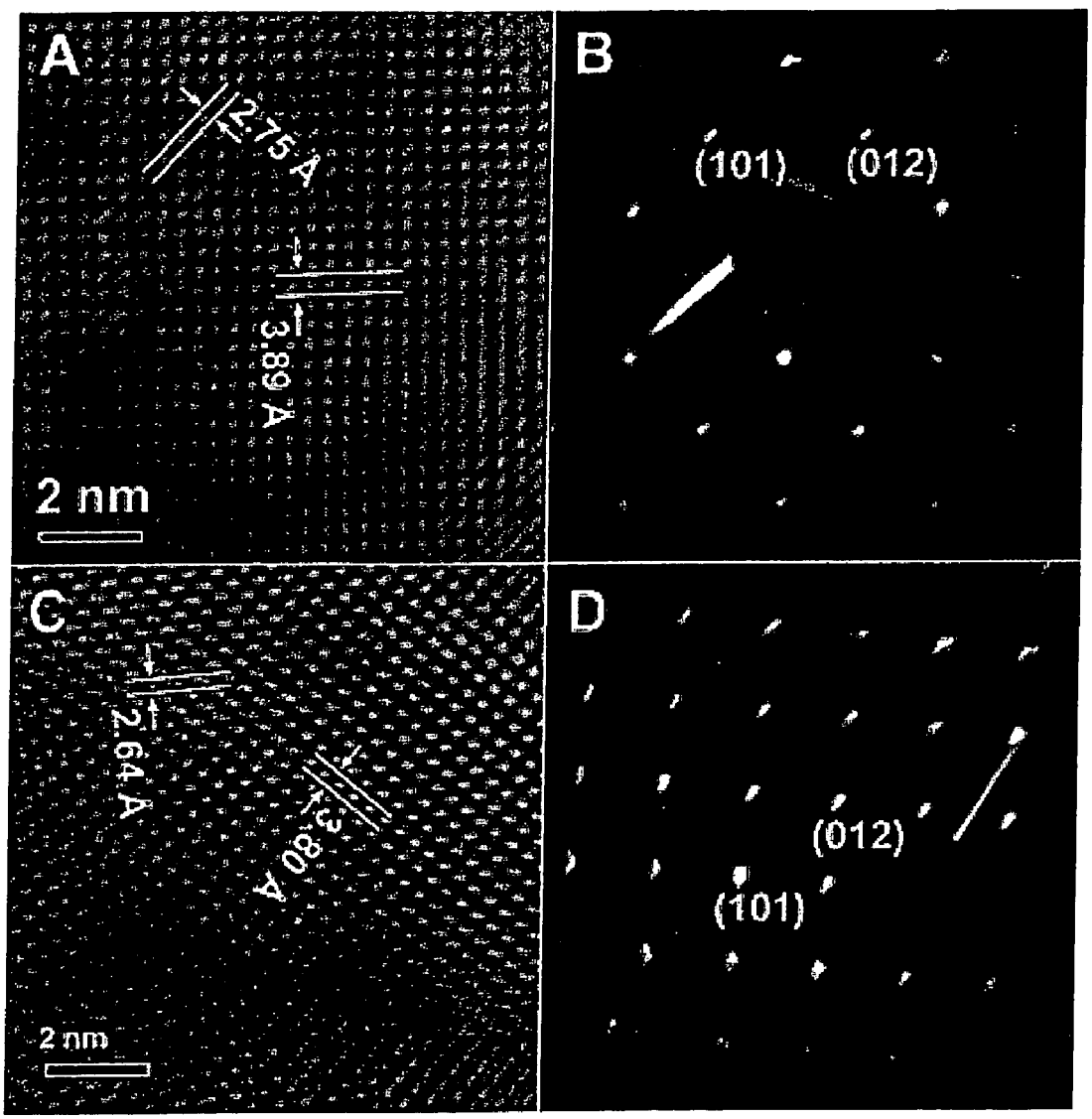
FIG. 18. HRTEM image of a typical portion of a $BiFeO_3$ nanoparticle generated from an annealing temperature at 400° C. (A) and 500° C. (C), and the corresponding SAED patterns are shown in (B) and (D), respectively.
Figure 19:
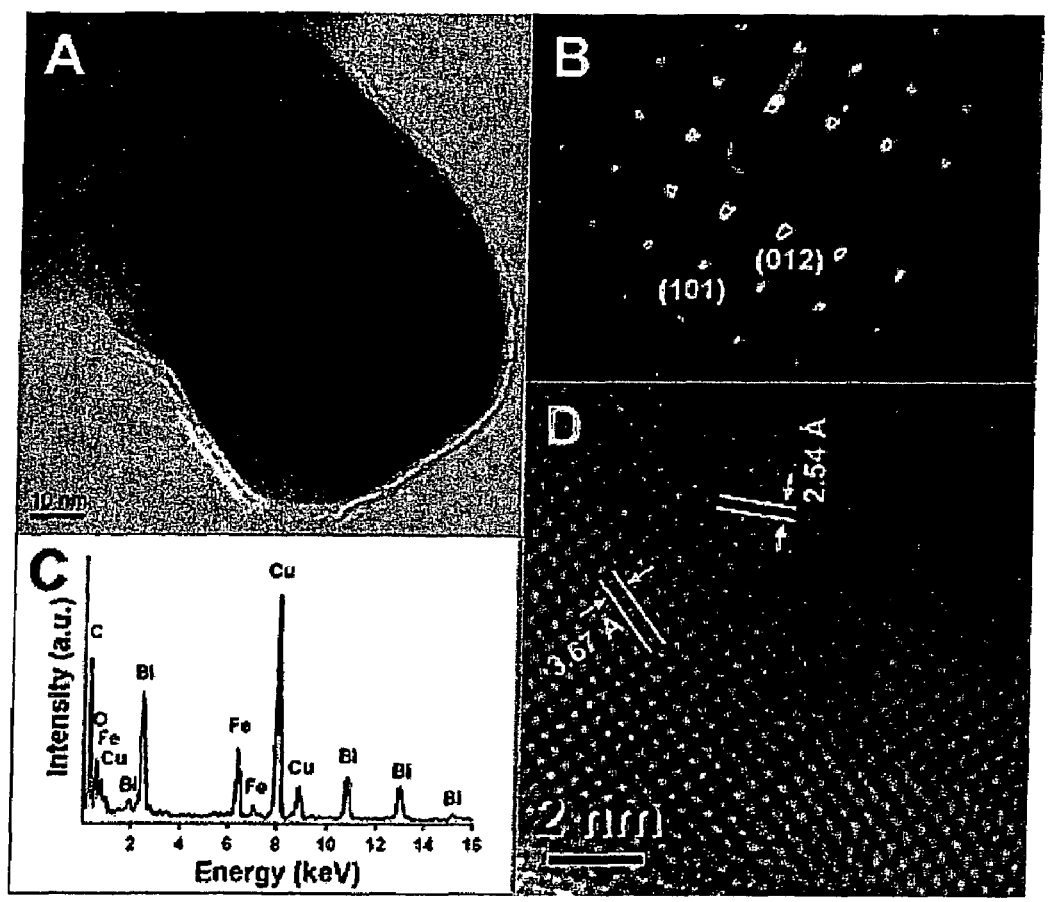
FIG. 19. TEM image (A) as well as SAED pattern (B) of an individual $BiFeO_3$ nanoparticle generated from the annealing temperature at 550° C., and its corresponding EDS (C). The Cu and C peaks originate from the TEM grid. (D) HRTEM image of a typical portion of a corresponding $BiFeO_3$ nanoparticle.

A typical transmission electron microscopy (TEM) image of as-prepared BiFeO$_3$ nanoparticles, generated at 600° C. from the present sol-gel method described above, is shown in FIG. 11A. Selected area electron diffraction (SAED) data taken from individual particles (FIG. 11B) show the presence of sharp diffraction spots, which are indicative of the formation of well-formulated, single-crystalline BiFeO$_3$. In order to confirm the chemical composition of these as-prepared structures, energy dispersive X-ray spectroscopy (EDS) spectra (FIG. 11C), taken at a number of selected positions of the sample, show the expected presence of Bi, Fe, and O. In FIG. 11D, a high-resolution TEM image obtained from a portion of an individual BiFeO$_3$ nanoparticle is displayed in order to further confirm the single-crystalline nature of the as-prepared BiFeO$_3$ samples. This image shows a typical crystalline domain with interplanar spacings of about 3.74 and 2.63 Å, compatible with literature values of 3.95 and 2.81 Å, respectively. The lattice spacings described above correspond to the {101} and {012} planes of a rhombohedral phase BiFeO$_3$ crystal (JCPDS #20-0169). Additional TEM, HRTEM, SAED, and EDS data are shown in FIGS. 18 and 19.

Figure 12:
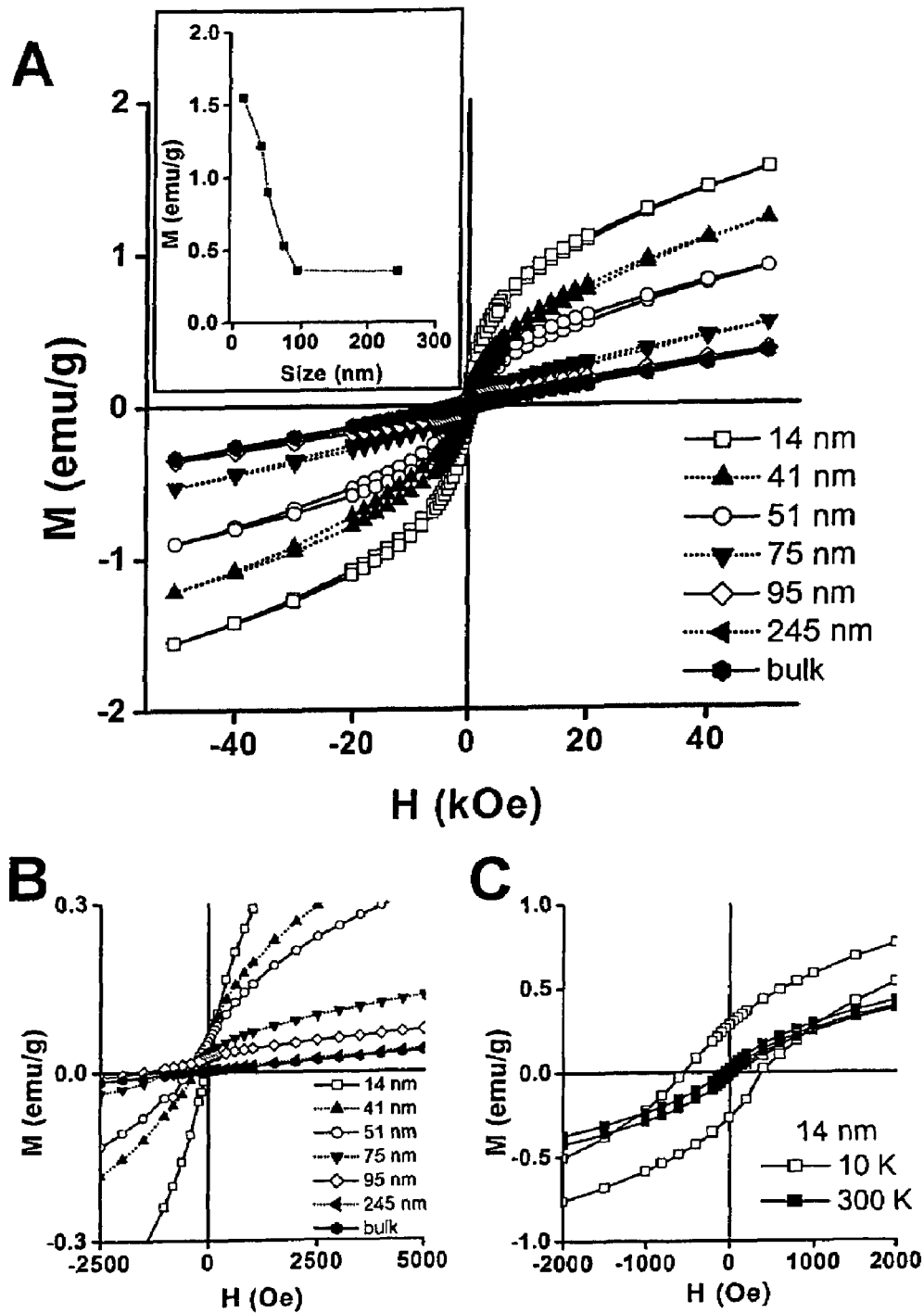
FIG. 12. (A) Hysteresis loops at 300 K for $BiFeO_3$ nanoparticles with indicated sizes, as well as of the bulk. The inset shows the magnetization behavior of as-prepared $BiFeO_3$ nanoparticles at 50 kOe as a function of size (diameter). (B) Expanded plots of magnetization of as-synthesized $BiFeO_3$ nanoparticles and of bulk samples with the return branches of the hysteresis loops omitted for clarity. (C) Corresponding magnetization data for the smallest nanoparticle prepared in this study (14 nm) at 10 K and 300 K, respectively, are also presented.

In order to investigate the magnetic properties of assemblies of the bismuth ferrite nanoparticles, magnetic measurements were performed on these as well as bulk BiFeO$_3$ using an MPMS magnetometer (FIG. 12). It is noteworthy that no magnetization saturation was ever attained below 50 kOe for any of the samples. The magnetic response observed as a function of the applied magnetic field increases systematically with decreasing size of the as-prepared BiFeO$_3$ nanoparticles. Moreover, the magnetic properties of bismuth ferrite nanoparticles with a mean size of 245 nm, prepared at an annealing temperature of 650° C., show a remarkable similarity to that of the bulk. In both cases, the spontaneous magnetization measured was not appreciable.

Results shown in FIG. 12 suggest that a magnetic response in BiFeO$_3$ can be initiated when the size of the system is less than about 95 nm (FIG. 12B). That is, whereas relatively larger BiFeO$_3$ nanoparticles, annealed at 600° C., with an average diameter of 95 nm, display a low level of spontaneous magnetization, the magnetic response of BiFeO$_3$ nanoparticles rapidly increases in the range of 270 to 460% for samples below 62 nm, the period length of the spiral-modulated spin structure of $BiFeO_3$, as compared with that of the bulk. A summary of the behavior of recorded $BiFeO_3$ magnetization values as a function of size is plotted in the inset to FIG. 12A. In addition, to illustrate the large hysteresis intrinsic to $BiFeO_3$ nanoparticles with dimensions smaller than 62 nm, the magnetization behavior for the smallest nanoparticles have been recorded at 10 K as well as 300 K (FIG. 12C). Magnetic parameters associated with nanoparticulate $BiFeO_3$ are summarized in Table 2. From the data (FIG. 12B), it is evident that the favorable magnetic properties of $BiFeO_3$ nanoparticles with typical dimensions below 62 nm strongly correlate with the size of the nanostructures themselves, due to their grain size confinement, an effect which has been found to modify the long-range spiral-modulated spin structure of $BiFeO_3$.[20] In addition, these size effects may also result in spin disorder, pinning, and frustrated magnetic interactions. Furthermore, a linear extrapolation of our experimental magnetization data from 14 to 75 nm $BiFeO_3$ samples suggests that the highest magnetization achievable for substrate-free bismuth ferrite nanoparticles can attain values of up to about 1.82 emu/g (0.11 $\mu_B$/Fe). To put this value in context, magnetization values of 0.06 to 1 $\mu_B$/Fe for epitaxially grown $BiFeO_3$ thin films have been previously reported though are not considered to be fully determinate.[15,16] By contrast, the magnetization values reported for as-prepared $BiFeO_3$ nanoparticles represent an attainable magnetization that can be ascribed essentially due to size effects alone, without the potentially distracting issues either of epitaxial strain (characteristic of thin films) or of oxygen vacancy defects. Specific applications at the nanoscale exploiting the behavior of antiferromagnets and ferrimagnets, such as those involving spintronics and spin valves, is useful with these nanoscale materials at room temperatures.[21]

The magnetic hysteretic behavior observed can be ascribed to a number of reasons, related to finite size effects and strong surface anisotropy contributions in the $BiFeO_3$ nanoparticles.[22] These various size-related factors include (a) the existence of a magnetically disordered surface layer in which direct competition of exchange interactions between surface spins takes place, (b) reduced symmetry and uncompensated magnetic interactions of surface spins, (c) the presence of non-stoichiometries and degree of cation vacancy disorder, and (d) the lack of sample crystallinity. Based on Mössbauer and other data, the first two factors are more relevant for describing the current system. For instance, the effect of a magnetically disordered surface layer on the magnetic properties becomes smaller as the particle size increases and eventually disappears for large enough particles.[22] In addition to a particle size decrease, the order-disorder characteristics of the sample also have a strong influence on the magnetization values observed.

Figure 13:
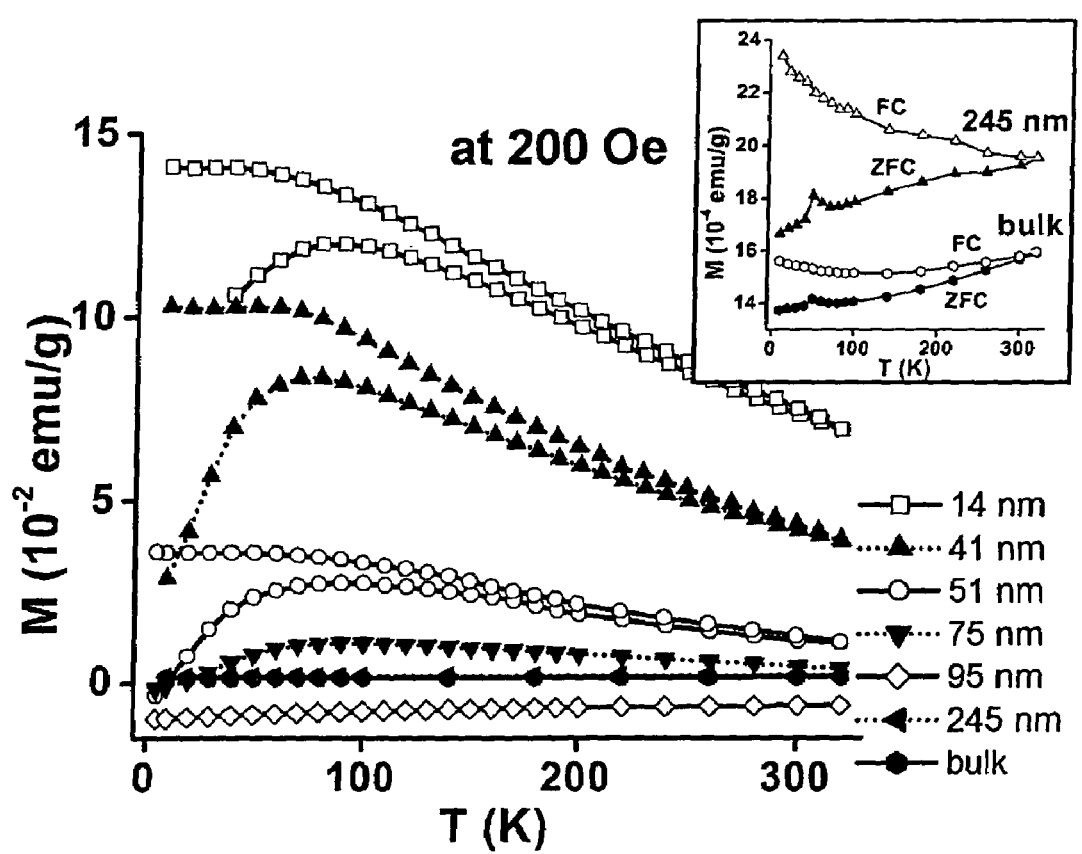
FIG. 13. Temperature dependence of the magnetic susceptibility for $BiFeO_3$ nanoparticles of varying sizes, showing zero field cooling (ZFC) and field cooling (FC) curves, with an applied magnetic field set at 200 Oe. The inset shows an expanded plot of ZFC and FC curves for $BiFeO_3$ nanoparticles with a diameter of 245 nm as well as for the bulk. Reproducible cusps are observed at 50 K.

To further investigate the magnetic characteristics of $BiFeO_3$ nanoparticles, magnetic susceptibility measurements as a function of temperature at an applied field strength of 200 Oe, after zero field cooling (ZFC) and also, with field cooling (FC) were also performed (FIG. 13). The temperature-dependent magnetizations observed are not reversible at 300 K and above; this behavior is characteristic of ferrimagnetic $BiFeO_3$ with a Néel temperature ($T_N$) located at 643 K. Data curves observed for $BiFeO_3$ nanoparticles with size dimensions lower than the intrinsic spiral spin structure period of 62 nm resemble each other in shape and show blocking temperatures ($T_B$) ranging from 75 to 95 K. The blocking temperature is the temperature at which the particle-moment fluctuation time due to thermally induced reversals of magnetization equals the characteristic measurement time scale of the experimental technique used.[23] In fact, $T_B$ values observed in ZFC curves suggest antiferromagnetic to superparamagnetic phase transitions for the as-prepared nanoparticles with size dimensions below the spiral structure period of 62 nm; these observations are consistent with the other results, including Mössbauer measurements. For particles with sizes greater than the spiral spin structures, the shapes of the magnetization versus temperature curves were remarkably similar to those of the bulk and furthermore, no blocking temperatures were observed (as shown in the inset). Note that the apparent sharp cusps observed in the magnetization curves at 50 K are reproducible for both bulk and bismuth ferrite samples with particle dimensions over 95 nm (e.g., 245 nm), as shown in the inset. Moreover, for these larger-scale samples, magnetic behaviors consistent with antiferromagnetic spin relaxations in ZFC curves and spin freezing in FC curves at sufficiently low temperatures were noted.

Figure 14:
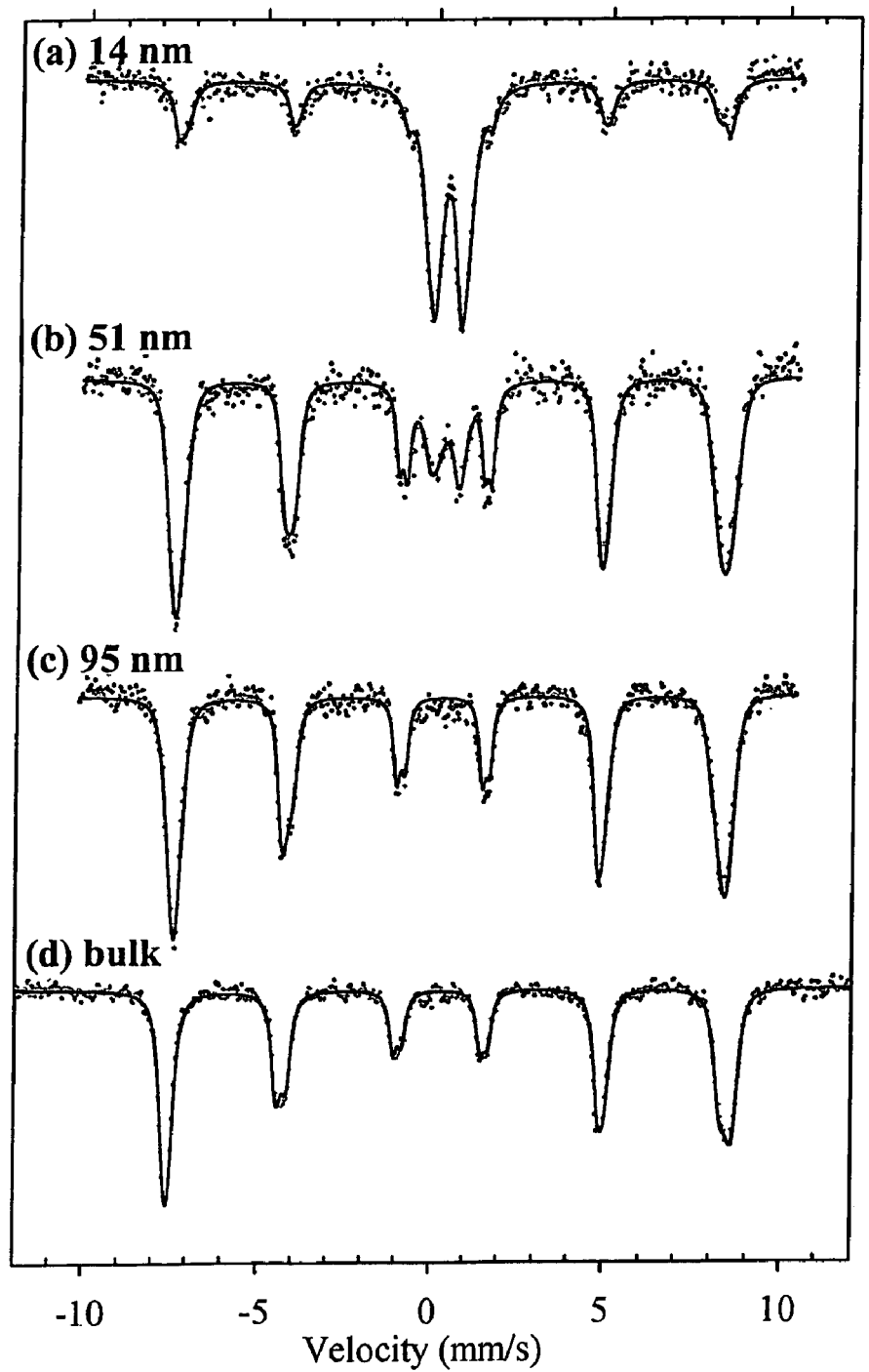
FIG. 14. Room temperature Mössbauer spectra of as-prepared $BiFeO_3$ nanoparticles with typical dimensions of (a) 14 nm, (b) 51 nm, (c) 95 nm, and (d) bulk $BiFeO_3$. The solid line is a least squares fit of the experimental data to theoretical spectra, assuming a superposition of inequivalent iron sites with Lorentzian absorption lines. Derived Mössbauer parameters are tabulated in Table S1.

The electronic and magnetic properties of bismuth ferrite nanoparticles were also systematically investigated by Mössbauer spectroscopy. Mössbauer spectra of $BiFeO_3$ nanoparticles with typical diameters of 14, 51 and 95 nm, respectively, are shown in FIGS. 14 and 20, together with corresponding spectra of bulk $BiFeO_3$. As noted in FIGS. 14$a$ and $b$, samples with particle sizes smaller than 62 nm, the known spiral spin structure, show superparamagnetic behavior at room temperature, giving rise to a superposition of quadrupolar (doublet) and magnetic (sixplet) absorption spectra, becoming progressively more magnetic with increasing annealing temperature. This indicates that agglomeration leading to the formation of larger particles takes place upon high-temperature annealing, approaching behavior similar to that of bulk material when the particle size approaches 95 nm and above. This tendency to particle size growth with increasing annealing temperature was also observed in our SEM data. The characteristic asymmetric, magnetic spectra of the bulk have been previously reported and have been reproduced by bulk material (FIG. 14$d$).[24] The observed asymmetry has been attributed to the presence of $Fe^{3+}$ in two different crystallographic environments that differ primarily in the size of the electric field gradient.[24] Least square fits of our experimental data to theoretical spectra give values for the isomer shift ($\delta$), quadrupole splitting ($\Delta E_Q$) and magnetic hyperfine field ($H_{hf}$) consistent with the presence of primarily ferric ions (Table 2).

Above its Néel temperature ($T_N \sim 643$ K), $BiFeO_3$ has been reported to exhibit a single doublet with a quadrupole splitting of about $\Delta E_Q = 0.44$ mm/s indicating a slightly distorted octahedral symmetry at the $Fe^{3+}$ site.[24] This is consistent with the crystal lattice of $BiFeO_3$ which is known to be a rhombohedrally distorted perovskite structure and in which the $Bi^{3+}$ and $Fe^{3+}$ cations are displaced from their centrosymmetric positions along the (111) axis. Below $T_N$, the magnetic interaction dominates with the quadrupolar splitting contributing a small perturbation to the observed overall magnetic structure.

Above the blocking temperature of the magnetically ordered particles, fast reversals of the particle's magnetic moment, due to thermal fluctuations, result in a zero average hyperfine magnetic field.[23,25] The magnetic spectra of the smaller particles in the distribution, with $T_B < 300$ K, collapse to quadrupolar spectra which are composed primarily of two inequivalent subsites that differ in the degree of site coordination distortion, as reflected by the values of the quadrupole splitting ($\delta_1 = 0.32$ mm/s, $\delta_2 = 0.31$ mm/s, $\Delta E_{Q1} = 0.71$ mm/s, $\Delta E_{Q2} = 1.09$ mm/s for the 400° C. annealed sample with average particle size of 14 nm, Table 2). One reasonable possibility to account for the weakening of magnetic coupling between particles is through the mediation of nonmagnetic surface imperfections and surface strain anisotropies that induce distortion and site in-equivalence on the crystallographic structure, resulting in an increase in the value of $\Delta E_Q$, due to magnetostrictive effects.[26] This observation is in accordance with the known multiferroic behavior of this system and the strong coupling between dielectric and magnetic properties.[27] Below $T_B$, two inequivalent magnetic sub-sites are observed with slightly different values of magnetic hyperfine fields ($H_{hf1}$=484 kOe and $H_{hf2}$=489 kOe for the 95 mg, 600° C. annealed sample; Table 2). These values are consistent with previously reported values for bulk $BiFeO_3$ at 80 K by $^{57}Fe$-Mössbauer and $^{57}Fe$—NMR spectroscopies.[24,28]

The present spectroscopic data was carefully examined for the presence of $Fe^{2+}$. No significant amounts could be detected. The only evidence we could obtain for $Fe^{2+}$ was a weak signature associated with a ~2% effect in the 300° C. preheated sample, contributing no more than 0.01 $\mu_B$/Fe to the observed magnetic signal. Hence, the amount of ferrous iron observed is not significant enough to explain the large increase in magnetization with decreasing particle size. As discussed above, the magnetization first increased at particle sizes smaller than the spin spiral wavelength, indicating that ferromagnetism can be induced by modulation of the spiral order. Furthermore, as the particle size diminishes and the surface-to-volume ratio increases, the contribution of surface spins to the total magnetic moment of the particle increases.[29] Defects, such as iron vacancies, varying Fe—O—Fe bond distances, angle distortions, and the number of uncompensated surface spins also increase, which can be attributed to the interruption of crystallographic and magnetic order at the surface. However, these defects do not appear to come primarily in the form of oxygen vacancies in our single-crystalline $BiFeO_3$ nanoparticles because, as we have mentioned, the presence of $Fe^{2+}$ is not consequential. In small particle magnetism, it is well established that surface anisotropies dominate magnetic behavior. Thus, the increase of magnetization in nanoscale bismuth ferrite nanoparticles are due primarily to strain anisotropies at the surface, shared by most magnetically ordered small particles, producing spin canting and non-collinear magnetic ordering leading to frustrated spin systems.[30]

Figure 15:
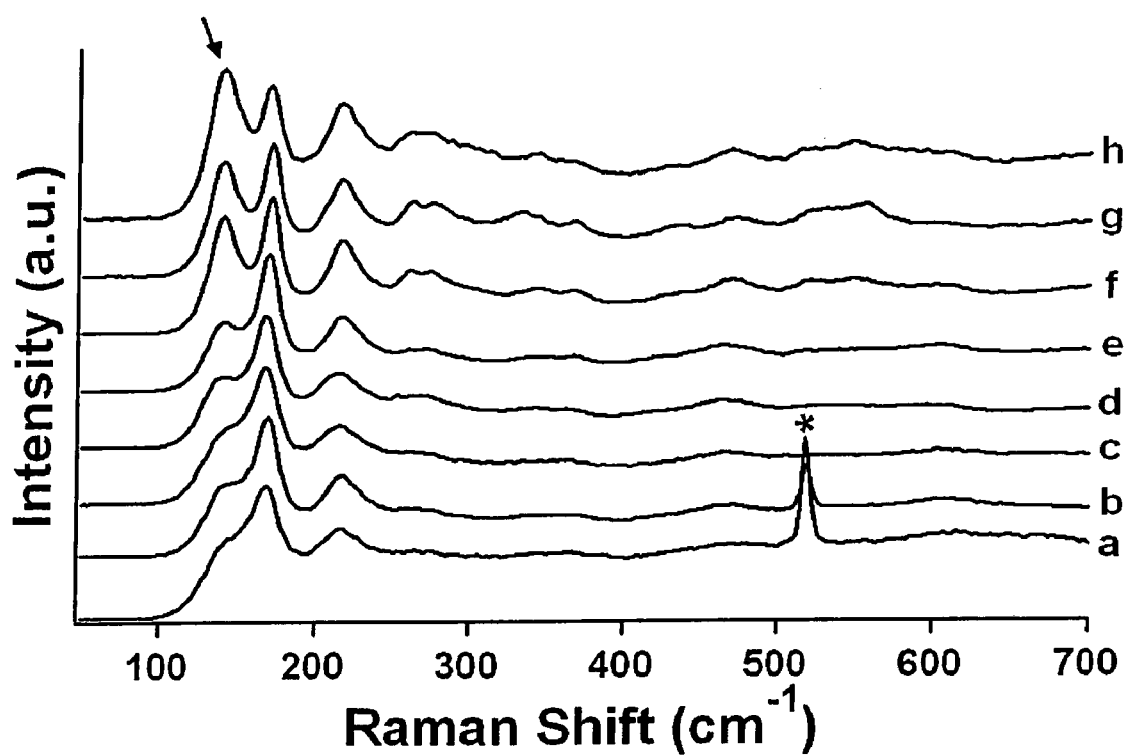
FIG. 15. Raman spectra of as-prepared $BiFeO_3$ nanoparticles with typical dimensions of (a) 14 nm, (b) 41 nm, (c) 51 nm, (d) 75 nm, (e) 95 nm, (f) 245 nm, and (g) 342 nm, respectively, as well as of the bulk (h). The Si substrate peaks have been indicated by an asterisk ((a) and (b)). The arrow indicates the peak at 136 $cm^{-1}$, corresponding to the first normal $A_l$ mode of bulk $BiFeO_3$.

To look for evidence of any coupling between the magnetic and electric properties in our nanoscale system as well as to corroborate the SQUID and Mössbauer data, a Raman study of randomly-oriented, as-prepared $BiFeO_3$ nanoparticles, shown in FIG. 15, was also completed. The peak at 136 cm$^{-1}$ (FIG. 25, denoted by an arrow) can be assigned to the first normal $A_l$ mode for the rhombohedral $BiFeO_3$ system.[31] The decrease in peak intensity of this normal $A_l$ mode with decreasing particle size is indicative of the suppression in the contribution of the Bi—O1 vibrational mode, which can most likely be attributed to enhanced coupling of magnetic, ferroelectric and/or structural order parameters due to size confinement considerations and accompanying lattice distortions in as-prepared $BiFeO_3$ nanoparticles. The decrease in the intensity of the 136 cm$^{-1}$ peak, observed for $BiFeO_3$ nanoparticles with size ranges up to 95 nm (FIG. 15a to e), coincides with the appearance of an appreciable spontaneous magnetization and hysteretic behavior in corresponding SQUID measurements (FIG. 12). By contrast, the lack of an appreciable hysteresis in SQUID data was correlated with an increased intensity of the 136 cm$^{-1}$ Raman peak for $BiFeO_3$ samples larger than 95 nm (FIGS. 15f and g). Also, by means of comparison that the Raman spectrum of bulk $BiFeO_3$ samples, shown in FIG. 15h, is in good agreement with that of previously reported data.[32]

In summary, this is the first reported study of the synthesis and characterization of pure-phase, substrate-free, and relatively strain-free (as compared with epitaxially grown films) single-crystalline $BiFeO_3$ nanoparticle specimens. These nanoparticles exhibit size-dependent magnetic behavior wherein the particles are analogous to incomplete magnetic supercells that retain a net magnetic moment. The critical observations relevant to applications are (a) improved magnetic behavior at the nanoscale due to size-confinement effects at room temperature and (b) the presence of insignificant amounts of $Fe^{2+}$ indicating the absence or great suppression of defects associated with oxygen deficiency. Oxygen vacancies that contribute to leakage problems in ceramic preparations of $BiFeO_3$ are primarily responsible for hindering potential device applications.[33,34] Suppression of oxygen vacancies is known to increase the resistivity and multiferroic behavior of these systems. Thus, samples derived from the present nanoscale systems should possess high resistivity and enhanced multiferroic properties with promising potential. The observation of hysteresis at room temperature is especially auspicious and could be further enhanced by rationally tailored shape anisotropy.

1. H. Schmid. *Ferroelectrics* 162, 317-338 (1994).
2. G. A. Smolenskii & I. E. Chupis. *Sov. Phys. Usp.* 25, 475-493 (1982).
3. M. Fiebig. *J. Phys. D: Appl. Phys.* 38, R123-R152 (2005).
4. M. Fiebig et al., *Nature* 419, 818-820 (2002).
5. N. Hur, et al. *Nature* 429, 392-395 (2004).
6. J. Wang, et al. *Science* 299, 1719-1722 (2003).
7. C. Ederer & N. A. Spaldin. *Phys. Rev. B* 71, 224103-224109 (2005).
8. I. Sosnowska, et al., *J. Phys. C Solid State Phys.* 15, 4835-4846 (1982).
9. T.-J. Park et al., *Chem. Commun.*, 2708-2709 (2004).
10. S. Ghosh et al., *J. Am. Ceram. Soc.* 88, 1349-1352 (2005).
11. K. Y. Yun et al., *J. Appl. Phys.* 96, 3399-3403 (2004).
12. X. Qi, et al., *J. Magn. Magn. Mater.* 283, 415-421 (2004).
13. S. K. Singh, et al., *Appl. Phys. Lett.* 88, 162904-1-162904-3 (2006).
14. Y.-H. Lee, et al., *Electrochem. Solid State Lett.* 8, F43-F46 (2005).
15. W. Eerenstein, et al., *Science* 307, 1203a (2005).
16. J. Wang, et al., *Science* 307, 1203b (2005).
17. J. B. Neaton, et al., *Phys. Rev. B* 71, 014113-014118 (2005).
18. C. Ederer & N. A. Spaldin. *Phys. Rev. B* 71, R060401-R060404 (2005).
19. Y. Tokura. *Science* 312, 1481-1482 (2006).
20. I. Sosnowska et al., *Appl. Phys. A* 74, S1040-S1042 (2002).
21. J. Dho, et al., *Adv. Mater.* 18, 1445-1448 (2006).
22. M. P. Morales et al., *Chem. Mater.* 11, 3058-3064 (1999).
23. L. Néel. *Ann. Geophys.* 5, 99-136 (1949).
24. C. Blaauw & F. van der Woude. *J. Phys. C: Solid State* 6, 1422-1431 (1973).
25. W. F. Brown, Jr. *J. Appl. Phys.* 39, 993-994 (1968).
26. A. del Moral. *Magnetostriction: Principles and Applications* (Institute of Physics Publications, Bristol, 2004).
27. E. K. H. Salje. *Phase transitions in ferroelectric and co-elastic crystals* (Cambridge University Press, Cambridge, 1990).
28. A. V. Zalessky, et al., *Europhys. Lett.* 50, 547-551 (2000).
29. T.-J. Park, et al., *J. Mater. Chem.* 15, 2099-2105 (2005).
30. J. M. D. Coey. *Phys. Rev. Lett.* 27, 1140-1142 (1971).

31. M. K. Singh, et al., *Phys. Rev. B* 72, 132101-132104 (2005).
32. H. Nadifi, et al., *Supercond. Sci. Technol.* 13, 1174-1179 (2000).
33. A. K. Pradhan et al., *J. Appl. Phys.* 97, 093903-093906 (2005).
34. Y. P. Wang et al., *Appl. Phys, Lett.* 84, 1731-1733 (2004).

Although preferred embodiments of the present invention have been described herein with reference to the accompanying drawings, it is to be understood that the invention is not limited to those precise embodiments and that various other changes and modifications may be effected herein by one skilled in the art without departing from the scope or spirit of the invention, and that it is intended to claim all such changes and modifications that fall within the scope of the invention.

Park et al., "Synthesis and characterization of multiferroic $BiFeO_3$ nanotubes" *Chem. Commun.*, 2004, 2708-2709 and Park et al., "Synthesis and characterization of submicron single-crystalline $Bi_2Fe_4O_9$ cubes" *J. Mater. Chem.*, 15: 2099-2105 (2005) are both incorporated herein by reference in their entireties.

The invention claimed is:

1. A method of making a single crystalline ternary nanostructure having the formula $A_xB_yO_z$, wherein x ranges from 0.25 to 24, y ranges from 0.5 to 40, z ranges from 2 to 100, and wherein A and B are independently selected from the group consisting of Ag, Al, As, Au, B, Ba, Bi, Br, Ca, Cd, Cl, Cm, Co, Cr, Cs, Cu, Dy, Er, Eu, F, Fe, Ga, Gd, Ge, Hf, Ho, I, In, Ir, K, La, Li, Lu, Mg, Mn, Mo, Na, Nb, Nd, Ni, Os, P, Pb, Pd, Pr, Pt, Re, Rh, Ru, S, Sb, Sc, Se, Si, Sm, Sn, Sr, Ta, Tb, Te, Ti, Tl, Tm, U, V, W, Y, Yb, and Zn comprising:
   (a) mixing an aqueous A reagent with an aqueous B reagent in an aqueous solvent to form a precursor mixture,
   (b) heating said precursor mixture to form a transparent sol comprising ternary oxide nanostructure precursors;
   (c) depositing droplets of the sol are onto a porous template surface thereby forming a nanostructure; and
   (d) retrieving the nanostructure.

2. The method of claim 1 wherein the single crystalline ternary nanostructure of $A_xB_yO_z$ has the formula $Bi_xM_yO_z$, wherein M is a transitional metal.

3. The method of claim 2 wherein the molar ratio of the bismuth reagent to the M-reagent is about 1.5~2 to 1.

4. The method of claim 1 wherein the single crystalline ternary nanostructure of $A_xB_yO_z$ has the formula $M'_xFe_yO_z$, wherein M' is a transitional metal.

5. The method of claim 4 wherein the molar ratio of the iron reagent to the M'-reagent is about 1.5~2 to 1.

6. The method of claim 1 wherein the single crystalline ternary nanostructure consists essentially of $BiFeO_3$ or $Bi_2Fe_4O_9$.

7. The method of claim 1 wherein the nanostructure is a nanocube, a nano-orthorhombus, a nanorod, a nanotube, rhombohedron or a nanoparticle.

8. A method of making a single crystalline ternary nanostructure having the formula $A_xB_yO_z$, wherein x ranges from 0.25 to 24, y ranges from 0.5 to 40, and z ranges from 2 to 100, and wherein A and B are selected from the group consisting of Ag, Al, As, Au, B, Ba, Bi, Br, Ca, Cd, Cl, Cm, Co, Cr, Cs, Cu, Dy, Er, Eu, F, Fe, Ga, Gd, Ge, Hf, Ho, I, In, Ir, K, La, Li, Lu, Mg, Mn, Mo, Na, Nb, Nd, Ni, Os, P, Pb, Pd, Pr, Pt, Re, Rh, Ru, S, Sb, Sc, Se, Si, Sm, Sn, Sr, Ta, Tb, Te, Ti, Tl, Tm, U, V, W, Y, Yb, and Zn comprising: mixing an A reagent with a B reagent in the presence of a surfactant and a salt to form a mixture: and heating the mixture to an annealing temperature to produce nanostructures.

9. The method of claim 8 wherein the single crystalline ternary nanostructure of $A_xB_yO_z$ has the formula $Bi_xM_yO_z$, wherein M is a transitional metal.

10. The method of claim 9 wherein the molar ratio of the bismuth reagent to the M-reagent ranges from about 1:1 to about 10:1.

11. The method of claim 8 wherein the single crystalline ternary nanostructure of $A_xB_yO_z$ has the formula $M'_xFe_yO_z$, wherein M' is a transitional metal.

12. The method of claim 11 wherein the molar ratio of the iron reagent to the M'-reagent ranges from about 1:1 to about 10:1.

13. The method of claim 8 wherein the single crystalline ternary nanostructure consists essentially of $BiFeO_3$ or $Bi_2Fe_4O_9$.

14. The method of claim 8 wherein the nanostructure is a nanocube, a nano-orthorhombus, a nanorod, a nanotube, rhombohedron or a nanoparticle.

15. A method of making a single crystalline ternary nanostructure having the formula $A_xB_yO_z$, wherein x ranges from 0.25 to 24, y ranges from 0.5 to 40, and z ranges from 2 to 100, and wherein A and B are independently selected from the group consisting of Ag, Al, As, Au, B, Ba, Bi, Br, Ca, Cd, Cl, Cm, Co, Cr, Cs, Cu, Dy, Er, Eu, F, Fe, Ga, Gd, Ge, Hf, Ho, I, In, Ir, K, La, Li, Lu, Mg, Mn, Mo, Na, Nb, Nd, Ni, Os, P, Pb, Pd, Pr, Pt, Re, Rh, Ru, S, Sb, Sc, Se, Si, Sm, Sn, Sr, Ta, Tb, Te, Ti, Tl, Tm, U, V, W, Y, Yb, and Zn comprising:
   (a) mixing an aqueous A reagent with an aqueous B reagent in an aqueous solvent to form a precursor mixture;
   (b) heating said precursor mixture to form a transparent sol comprising ternary oxide nanostructure precursors; and
   (c) removing solvent.

16. The method of claim 15 wherein the single crystalline ternary nanostructure of $A_xB_yO_z$ has the formula $Bi_xM_yO_z$, wherein M is a transitional metal.

17. The method of claim 16 wherein the M reagent is bismuth nitrate hydrate.

18. The method of claim 15 wherein the single crystalline ternary nanostructure of $A_xB_yO_z$ has the formula $M'_xFe_yO_z$, wherein M' is a transitional metal.

19. The method of claim 15 wherein the single crystalline ternary nanostructure consists essentially of $BiFeO_3$ or $Bi_2Fe_4O_9$.

20. The method of claim 15 further comprising placing the precursor mixture on a template before heating.

* * * * *